United States Patent
Suematsu

(12) 
(10) Patent No.: US 6,973,328 B1
(45) Date of Patent: Dec. 6, 2005

(54) MILLIMETER WAVE BAND TRANSMITTER, MILLIMETER WAVE BAND RECEIVER AND MILLIMETER WAVE BAND COMMUNICATION APPARATUS CARRYING OUT RADIO COMMUNICATION IN MILLIMETER WAVE BAND REGION

(75) Inventor: Eiji Suematsu, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 801 days.

(21) Appl. No.: 09/588,548

(22) Filed: Jun. 7, 2000

(30) Foreign Application Priority Data

Jun. 7, 1999 (JP) ................................ 11-158883

(51) Int. Cl.$^7$ .......................... H04M 1/00; H04B 1/40; H04B 1/16; H04J 1/00
(52) U.S. Cl. .............................. 455/552.1; 455/553.1; 455/86; 455/132; 455/207; 455/314; 455/334; 455/102; 370/343; 370/344
(58) Field of Search ................................ 455/552, 553, 455/132, 86, 141, 205, 207, 209, 313–315, 455/318, 319, 552.1, 553.1, 102, 103, 112, 455/113, 334, 338; 375/219, 316, 349; 370/343, 370/344, 319, 339

(56) References Cited

U.S. PATENT DOCUMENTS

| | | | | |
|---|---|---|---|---|
| 2,233,183 | A | * | 2/1941 | Roder .......................... 332/123 |
| 4,361,728 | A | * | 11/1982 | Tanabe ........................ 370/204 |
| 4,965,852 | A | * | 10/1990 | Sasaki .......................... 455/82 |
| 5,610,559 | A | * | 3/1997 | Dent ............................... 331/2 |
| 5,712,602 | A | | 1/1998 | Suematsu |
| 5,930,682 | A | * | 7/1999 | Schwartz et al. ............. 455/14 |
| 6,081,691 | A | * | 6/2000 | Renard et al. ............. 455/12.1 |
| 6,185,201 | B1 | * | 2/2001 | Kiyanagi et al. ........... 370/343 |
| 6,407,837 | B1 | * | 6/2002 | Spickermann ............... 398/163 |
| 6,609,010 | B1 | * | 8/2003 | Dolle et al. .................. 455/552 |

FOREIGN PATENT DOCUMENTS

| | | | |
|---|---|---|---|
| JP | 03-254236 | A | 11/1991 |
| JP | 5136715 | A | 6/1993 |
| JP | 09-162767 | A | 6/1997 |

* cited by examiner

*Primary Examiner*—Duc M. Nguyen
(74) *Attorney, Agent, or Firm*—Birch, Stewart, Kolasch & Birch, LLP

(57) ABSTRACT

A millimeter wave band communication apparatus includes a millimeter wave band transmitter receiving a plurality of input modulation signal waves to transmit a millimeter wave band multiplex signal wave, and a millimeter wave band receiver receiving the transmitted millimeter wave band multiplex signal wave to restore the plurality of input modulation signal waves. The millimeter wave band transmitter includes a frequency arranging circuit generating a multiplex signal wave having respective frequency bands of the plurality of input modulation signal waves arranged on the frequency axis independent of each other, a frequency up-converter up-converting the generated multiplex signal wave to the millimeter wave band, and a transmission circuit transmitting the millimeter wave band multiplex signal wave. The millimeter wave band receiver includes a reception circuit receiving the millimeter wave band multiplex signal wave, a frequency down-converter down-converting the millimeter wave band multiplex signal wave from the millimeter wave band, and a frequency rearranging circuit restoring the down-converted multiplex signal wave into the plurality of input modulation signal waves respectively having the former frequency bands.

47 Claims, 13 Drawing Sheets

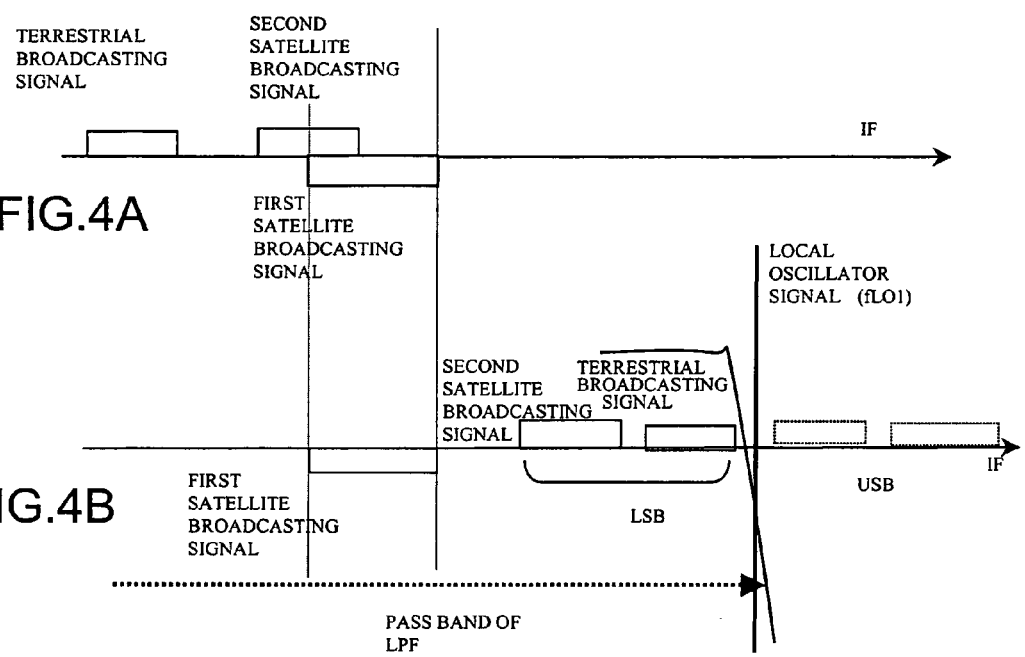
FIG.4A
FIG.4B
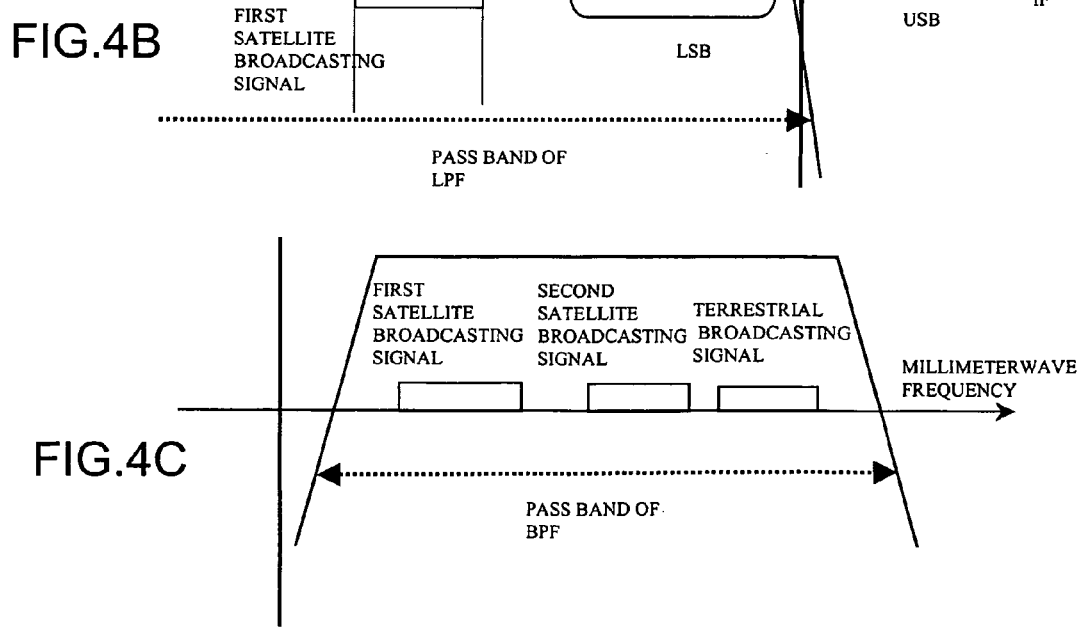
FIG.4C

MILLIMETER WAVE BAND TRANSMITTER, MILLIMETER WAVE BAND RECEIVER AND MILLIMETER WAVE BAND COMMUNICATION APPARATUS CARRYING OUT RADIO COMMUNICATION IN MILLIMETER WAVE BAND REGION

BACKGROUND OF THE INVENTION

1. Field of the Invention

The present invention relates to millimeter wave band transmitters, millimeter wave band receivers and millimeter wave band communication apparatuses. More particularly, the present invention relates to a millimeter wave band transmitter, a millimeter wave band receiver and a millimeter wave band communication apparatus that can multiplex a plurality of modulation signal waves to perform radio communication in a millimeter wave band region.

2. Description of the Background Art

A conventional radio communication apparatus for radio communication in an UHF (Ultra High Frequency) band region is used in practice. The need arises for a radio communication apparatus that allows radio communication at a millimeter wave band region which is a higher frequency wave band region, based on the conventional radio communication apparatus of the UHF band without improvement of the communication apparatus per se.

Japanese Patent Laying-Open No. 5-136715 proposes a radio communication apparatus that can up-convert the radio frequency up to the millimeter wave band using the conventional radio communication apparatus of the UHF band as the base.

FIG. 13 is a schematic block diagram showing a structure of a radio communication apparatus of a millimeter wave band based on a conventional radio communication apparatus of the UHF band disclosed in the foregoing document. Referring to FIG. 13, the transmitter of the radio communication apparatus of the millimeter wave band includes a data input terminal 204, a conventional communication circuit 201a of the UHF band, a wide band modulator 206a, a millimeter wave transmitter 207a, and an antenna 208a. The receiver includes an antenna 208b, a millimeter wave receiver 207b, a wide band demodulator 206b, a conventional communication circuit 201b of the UHF band, and a data output terminal 205.

In the transmitter, a data signal is applied to communication circuit 201a via data input terminal 204. Communication circuit 201a generates a modulation signal wave of the UHF band in the conventional manner and provides the same to wide band modulator 206a. Wide band modulator 206a directly modulates the carrier wave of the millimeter wave band by the modulation signal of the UHF band and provides the modulated wave to millimeter wave transmitter 207a. Millimeter wave transmitter 207a emits the modulated signal wave of the millimeter wave band via antenna 208a.

Signal wave 203 emitted via antenna 208a is received by millimeter wave receiver 207b via antenna 208b of the receiver. The signal wave of the millimeter wave band received at millimeter wave receiver 207b is applied to wide band demodulator 206b. Wide band demodulator 206b down-converts the signal wave of the millimeter wave band to demodulate a signal wave of the UHF band. The demodulated signal wave of the UHF band is applied to communication circuit 201b. Communication circuit 201b reproduces the data from the signal wave of the UHF band. The data is output via data output terminal 205.

In the conventional millimeter wave radio communication apparatus of the structure shown in FIG. 13, wide band modulator 206a is configured to directly modulate the carrier wave of a frequency fc of the millimeter wave band with the signal component of frequency fu of the UHF band (or a band lower than the UHF band) output from the conventional communication circuit 201a of the UHF band. Therefore, the transmitted modulation wave of the millimeter wave band will have a transmission spectrum in the frequency range of fc~fc±fu which is in the vicinity of the carrier wave.

The suppression of the carrier wave at the millimeter wave band is only about 20 dB no matter what kind of modulator is used. If such a modulation wave is directly transmitted, much of the power component of the carrier wave will be included. As a result, the power efficiency with respect to the signal component that is to be originally transmitted is degraded significantly. There is a problem that the radio transmission distance is shortened.

Since a modulation/demodulation process is directly applied on the carrier wave in the millimeter wave band in the conventional communication apparatus of FIG. 13, it is desired that the spurious component in the carrier wave of the millimeter wave band is as small as possible. However, it is difficult to form a carrier wave of the millimeter wave band reduced in spurious component.

The radio communication apparatus conventionally used in practice is configured to multiplex a plurality of input signals of the UHF band on the frequency axis to up-convert the same into a multiplex signal wave of the millimeter wave band for transmission. FIG. 14 is a schematic block diagram showing a structure of such a conventional radio communication apparatus.

Referring to FIG. 14, a plurality of data signals input to a plurality of communication circuits 201a, . . . , 201a via a plurality of terminals 204, . . . , 204 are converted into signals of the UHF band by communication circuits 201a, . . . , 201a, respectively, and added together by an adder 211. The plurality of signals multiplexed by the addition are up-converted into a modulation signal wave of the millimeter wave band by a wide band modulator 206a to be output via a millimeter transmitter 207a and antenna 208a.

According to the structure of FIG. 14, multiplexing of the plurality of signals of the UHF band is carried out on the frequency axis simply using adder 211. Therefore, there was a problem that, if there is an overlap of the frequency components among the plurality of signals of the UHF band, such a signal cannot be multiplexed.

SUMMARY OF THE INVENTION

In view of the foregoing, an object of the present invention is to provide a millimeter wave band transmitter, a millimeter wave band receiver and a millimeter wave band communication apparatus of high transmission efficiency.

Another object of the present invention is to provide a millimeter wave band transmitter, a millimeter wave band receiver and a millimeter wave band communication apparatus realizing up-converting and down-converting to and from the millimeter wave band with a small spurious component without directly modulating the carrier wave of the millimeter wave band.

A further object of the present invention is to provide a millimeter wave band transmitter, a millimeter wave band receiver and a millimeter wave band communication apparatus that can multiplex a plurality of signal components on a frequency axis for transmission at a millimeter wave band even if the frequency wave bands overlap.

According to an aspect of the present invention, a millimeter wave band transmitter includes a frequency arranging circuit, a frequency up-converter and a transmission circuit. The frequency arranging circuit couples a plurality of input modulation signal waves while converting the frequency of at least one of the plurality of input modulation signal waves to generate a multiplex signal wave having respective frequency bands of the plurality of input modulation signal waves arranged independent of each other on a frequency axis. The frequency up-converter up-converts the multiplex signal wave to a millimeter wave band to generate a millimeter wave band multiplex signal wave. The transmission circuit transmits the millimeter wave band multiplex signal wave.

According to another aspect of the present invention, a millimeter wave band receiver includes a reception circuit, a frequency down-converter and a frequency rearranging circuit. The reception circuit receives a millimeter wave band multiplex signal wave generated by coupling a plurality of modulation signal waves while converting the frequency of at least one of the plurality of modulation signal waves, and having respective frequency bands of the plurality of modulation signal waves arranged independent of each other on a frequency axis. The frequency down-converter down-converts the millimeter wave band multiplex signal wave from the millimeter wave band to generate a multiplex signal wave. The frequency rearranging circuit restores the plurality of modulation signal waves respectively having the former frequency wave bands by dividing the multiplex signal wave while converting the frequency of the at least one modulation signal wave.

According to a further aspect of the present invention, a millimeter wave band communication apparatus includes a millimeter wave band transmitter receiving a plurality of input modulation signal waves and transmitting a millimeter wave band multiplex signal wave, and a millimeter wave band receiver receiving the transmitted millimeter wave band multiplex signal wave to restore the plurality of input modulation signal waves. The millimeter wave band transmitter includes a frequency arranging circuit, a frequency up-converter, and a transmission circuit. The frequency arranging circuit couples the plurality of input modulation signal waves while converting the frequency of at least one of the plurality of input modulation signal waves to generate a multiplex signal wave having respective frequency wave bands of the plurality of input modulation signal waves arranged independent of each other on a frequency axis. The frequency up-converter up-converts the multiplex signal wave to the millimeter wave band to generate the millimeter wave band multiplex signal wave. The transmission circuit transmits the millimeter wave band multiplex signal wave. The millimeter wave band receiver includes a reception circuit, a frequency down-converter, and a frequency rearranging circuit. The reception circuit receives the millimeter wave band multiplex signal wave. The frequency down-converter down-converts the millimeter wave band multiplex signal wave from the millimeter wave band to generate the multiplex signal wave. The frequency rearranging circuit restores the plurality of input modulation signal waves respectively having the former frequency bands by dividing the multiplex signal wave while converting the frequency of the at least one modulation signal wave.

According to still another aspect of the present invention, a millimeter wave band transmitter includes a first input terminal, a second input terminal, a first local oscillator, a first frequency mixer, a signal combiner, a second local oscillator, a second frequency mixer and a transmission circuit. A first modulation signal wave is input to the first input terminal. A second modulation signal wave is input to the second input terminal. The first local oscillator generates a first local oscillation signal of a first local oscillation frequency. The first frequency mixer converts the frequency of the first modulation signal wave by mixing the first modulation signal wave with the first local oscillation signal. The signal combiner couples the frequency-converted first modulation signal wave with the second modulation signal wave to generate a multiplex signal wave. The second local oscillator generates a second local oscillation signal of a second local oscillation frequency. The second frequency mixer mixes the multiplex signal wave with the second local oscillation signal to up-convert the multiplex signal wave to the millimeter wave band to generate a millimeter wave band multiplex signal wave. The transmission circuit transmits the millimeter wave band multiplex signal wave.

According to yet a further aspect of the present invention, a millimeter wave band receiver includes a reception circuit, a first local oscillator, a first frequency mixer, a signal distributor, a second local oscillator, a second frequency mixer, a first output terminal, and a second output terminal. A multiplex signal wave generated by coupling first and second modulation signal waves after the frequency of the first modulation signal wave is converted by a first local oscillation frequency is up-converted to the millimeter wave band by a second local oscillation frequency to be transmitted to the reception circuit as a millimeter wave band multiplex wave signal. The first local oscillator generates a first local oscillation signal of the second local oscillation frequency. The first frequency mixer mixes the millimeter wave band multiplex signal wave with the first local oscillation signal to down-convert the millimeter wave band multiplex signal wave from the millimeter wave band to generate the multiplex signal wave. The signal distributor divides the down-converted multiplex signal wave into the frequency-converted first modulation signal wave, and a second modulation signal wave. The second local oscillator generates a second local oscillation signal of the first local oscillation frequency. The second frequency mixer mixes the frequency-converted first modulation signal wave with the second local oscillation signal to convert again the frequency of the first modulation signal wave to restore the first modulation signal wave. The first output terminal outputs the restored first modulation signal wave. The second output terminal outputs the second modulation signal wave supplied from the signal distributor.

According to yet another aspect of the present invention, a millimeter wave band communication apparatus includes a millimeter wave band transmitter receiving first and second input modulation signal waves to transmit a millimeter wave band multiplex signal wave, and a millimeter wave band receiver receiving the millimeter wave band multiplex signal wave to restore the first and second modulation signal waves. The millimeter wave band transmitter includes a first input terminal, a second input terminal, a first local oscillator, a first frequency mixer, a signal combiner, a second local oscillator, a second frequency mixer and a transmission circuit. The first modulation signal wave is input to the first input terminal. The second modulation signal wave is input to the second input terminal. The first local oscillator generates a first local oscillation signal of a first local oscillation frequency. The first frequency mixer converts the frequency of the first modulation signal wave by mixing the first modulation signal wave with the first local oscillation signal.

The signal combiner couples the frequency-converted first modulation signal wave with the second modulation signal wave to generate a multiplex signal wave. The second local oscillator generates a second local oscillation signal of a second local oscillation frequency. The second frequency mixer up-converts the multiplex signal wave to the millimeter wave band to generate the millimeter wave band multiplex signal by mixing the multiplex signal wave with the second local oscillation signal. The transmission circuit transmits the millimeter wave band multiplex signal wave. The millimeter wave band reception circuit includes a reception circuit, a third local oscillator, a third frequency mixer, a signal distributor, a fourth local oscillator, a fourth frequency mixer, a first output terminal and a second output terminal. The reception circuit receives the transmitted millimeter wave band multiplex signal wave. The third local oscillator generates a third local oscillation signal of the second local oscillation frequency. The third frequency mixer down-converts the millimeter wave band multiple signal wave from the millimeter wave band to generate the multiplex signal wave by mixing the millimeter wave band multiplex signal wave with the third local oscillation signal. The signal distributor divides the down-converted multiplex signal wave into the first frequency-converted modulation signal wave, and the second modulation signal wave. The fourth local oscillator generates a fourth local oscillation signal of the first local oscillation frequency. The fourth frequency mixer converts the frequency again of the first modulation signal wave to restore the first modulation signal wave by mixing the frequency-converted first modulation signal wave with the fourth local oscillation signal. The first output terminal provides the restored first modulation signal wave. The second output terminal provides the second modulation signal wave supplied from the signal distributor.

According to yet a still further aspect of the present invention, a millimeter wave band transmitter includes a first input terminal, a second input terminal, a third input terminal, a first signal combiner, a first local oscillator, a first frequency mixer, a second signal combiner, a second local oscillator, a second frequency mixer and a transmission circuit. A first modulation signal wave is input to the first input terminal. A second modulation signal wave is input to the second input terminal. A third modulation signal wave is input to the third input terminal. The first signal combiner couples the first modulation signal wave with the third modulation signal wave to generate a first multiplex signal wave. The first local oscillator generates a first local oscillation signal of a first local oscillation frequency. The first frequency mixer mixes the first multiplex signal wave with the first local oscillation signal to convert the frequency of the first multiplex signal wave. The second signal combiner couples the frequency-converted first multiplex signal wave with the second modulation signal wave to generate a second multiplex signal wave. The second local oscillator generates a second local oscillation signal of a second local oscillation frequency. The second frequency mixer up-converts the second multiplex signal wave to the millimeter wave band to generate a millimeter wave band multiplex signal wave by mixing the second multiplex signal wave with the second local oscillation signal. The transmission circuit transmits the millimeter wave band multiplex signal wave.

According to an additional aspect of the present invention, a millimeter wave band receiver includes a reception circuit, a first local oscillator, a first frequency mixer, a first signal distributor, a second local oscillator, a second frequency mixer, a second signal distributor, a first output terminal, a second output terminal, and a third output terminal. A second multiplex signal wave generated by coupling a first multiplex signal wave generated by coupling first and third modulation signal waves with a second modulation signal wave after the first multiplex signal wave is converted in frequency by a first local oscillation frequency is up-converted to the millimeter wave band by a second local oscillation frequency and transmitted to be received by the reception circuit as a millimeter wave band multiplex signal wave. The first local oscillator generates a first local oscillation signal of the second local oscillation frequency. The first frequency mixer down-converts the millimeter wave band multiplex signal wave from the millimeter wave band to generate the second multiplex signal wave by mixing the millimeter wave band multiplex signal wave with the first local oscillation signal. The first signal distributor divides the down-converted second multiplex signal wave into the frequency-converted first multiplex signal wave, and a second modulation signal wave. The second local oscillator generates a second local oscillation signal of the first local oscillation frequency. The second frequency mixer converts again the frequency of the first multiplex signal to restore the first multiplex signal wave by mixing the first frequency-converted multiplex signal wave with the second local oscillation signal. The second signal distributor divides the restored first multiplex signal wave into the first modulation signal wave and the third modulation signal wave. The first output terminal provides the first modulation signal wave supplied from the second signal distributor. The second output terminal provides the second modulation signal wave supplied from the first signal distributor. The third output terminal provides the third modulation signal wave supplied from the second signal modulator.

According to a further additional aspect of the present invention, a millimeter wave band communication apparatus includes a millimeter wave band transmitter receiving first, second and third input modulation signal waves to transmit a millimeter wave band multiplex signal wave, and a millimeter wave band receiver receiving the millimeter wave band multiplex signal wave to restore the first, second and third modulation signal waves. The millimeter wave band transmitter includes a first input terminal, a second input terminal, a third input terminal, a first signal combiner, a first local oscillator, a first frequency mixer, a second signal combiner, a second local oscillator, a second frequency mixer and a transmission circuit. The first modulation signal wave is input to the first input terminal. The second modulation signal wave is input to the second input terminal. The third modulation signal wave is input to the third input terminal. The first signal combiner couples the first modulation signal wave with the third modulation signal wave to generate a first multiplex signal wave. The first local oscillator generates a first local oscillation signal of a first local oscillation frequency. The first frequency mixer converts the frequency of the first multiplex signal wave by mixing the first multiplex signal wave with the first local oscillation signal. The second signal combiner generates a second multiplex signal wave by coupling the frequency-converted first multiplex signal wave with the second modulation signal wave. The second local oscillator generates a second local oscillation signal of the second local oscillation frequency. The second frequency mixer up-converts the second multiplex signal wave to the millimeter wave band to generate the millimeter wave band multiplex signal wave by mixing the second multiplex signal wave with the second local oscillation signal. The transmission circuit transmits the millimeter wave band multiplex signal wave. The millimeter wave band receiver includes a reception circuit, a third local oscillator, a third frequency mixer, a first signal distributor, a fourth local oscillator, a fourth frequency mixer, a second signal distributor, a first output terminal, a second output terminal and a third output terminal. The reception circuit receives the transmitted millimeter wave band multiplex signal wave. The third local oscillator generates a third local oscillation signal of the second local oscillation frequency. The third frequency mixer down-converts the millimeter wave band multiplex signal wave from the millimeter wave band to generate the second multiplex signal wave by mixing the millimeter wave band multiplex signal wave with the third local oscillation signal. The first signal distributor divides the down-converted second multiplex signal wave into the frequency-converted first multiplex signal wave, and a second modulation signal wave. The fourth local oscillator generates a fourth local oscillation signal of the first local oscillation frequency. The fourth frequency mixer converts again the frequency of the first multiplex signal wave to restore the first multiplex signal wave by mixing the frequency-converted first multiplex signal wave with the fourth local oscillation signal. The second signal distributor divides the restored first multiplex signal wave into the first modulation signal wave and the third modulation signal wave. The first output terminal provides the first modulation signal wave supplied from the second signal distributor. The second output terminal provides the second modulation signal wave supplied from the first signal distributor. The third output terminal provides the third modulation signal wave supplied from the second signal distributor.

According to the present invention, an input modulation signal wave of low frequency is temporarily converted in frequency and then up-converted to the millimeter wave band by frequency conversion using the local oscillation signal. Therefore, suppression of an unwanted signal included in the transmitted signal at the millimeter wave band is facilitated to allow improvement of the transmission efficiency in radio communication at the millimeter wave band.

According to the present invention, it is not necessary to prepare a millimeter wave band carrier wave of low spurious component and in synchronization between transmission and reception since a structure directly applying modulation and demodulation on the carrier wave of the millimeter wave band is not employed.

According to the present invention, a plurality of input modulation signal waves are coupled while converting the frequency of at least one of the input modulation signal waves. Therefore, a multiplex signal wave of a plurality of input modulation signals whose respective frequency bands are arranged independent of each other on a frequency axis can be generated and up-converted to the millimeter wave band. Thus, input modulation signals can be multiplexed on a frequency axis to be transmitted even through the input modulation signals have overlapping frequency bands.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 4A, 4B and 4C represent the frequency spectrum of the millimeter wave band communication apparatus of the second embodiment.

DESCRIPTION OF THE PREFERRED EMBODIMENTS

(1) First Embodiment

A millimeter wave band radio communication apparatus according to a first embodiment of the present invention will be described with reference to FIGS. 1A and 1B.

Figure 1A:
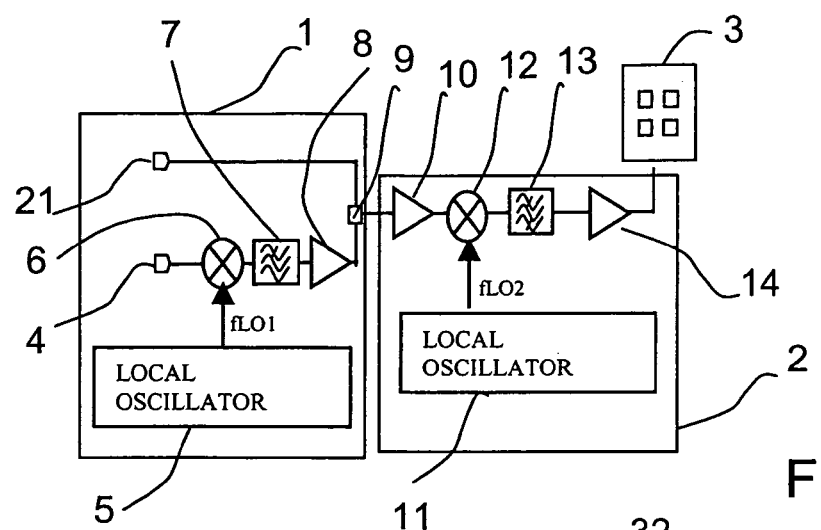
FIG. 1A is a schematic block diagram showing a millimeter wave band transmitter forming a millimeter wave band communication apparatus according to a first embodiment of the present invention.

Referring to FIG. 1A, the millimeter wave band transmitter of the first embodiment basically includes a frequency arranging circuit 1 and a frequency up-converter 2.

Figure 2A:
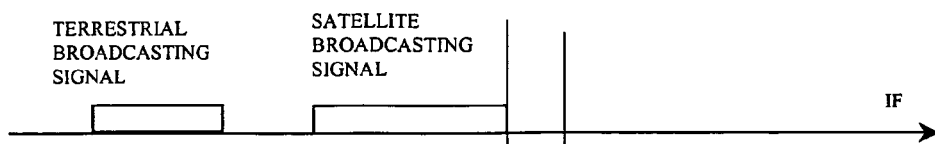
FIGS. 2A, 2B and 2C represent the frequency spectrum of the millimeter wave band communication apparatus of the first embodiment.

Frequency arranging circuit 1 includes input terminals 4 and 21 receiving modulation signal waves that are to be transmitted. The first embodiment will be described corresponding to the case where a signal of the UHF band of a terrestrial TV broadcast (referred to as "terrestrial broadcasting signal" hereinafter) is applied to input terminal 4 as a first modulation signal wave and a signal of an intermediate frequency band of a satellite TV broadcast (referred to as "satellite broadcasting signal" hereinafter) is input to input terminal 21 as a second modulation signal wave, by way of example. FIG. 2A shows the arrangement of the input terrestrial broadcasting signal and satellite broadcasting signal on the frequency axis.

The input modulation signal waves are not limited to those described above. Various modulation signal waves can be employed such as a broadcasting signal wave of a cable TV broadcast or a modulation signal wave of a signal output from a video camera.

Figure 2B:
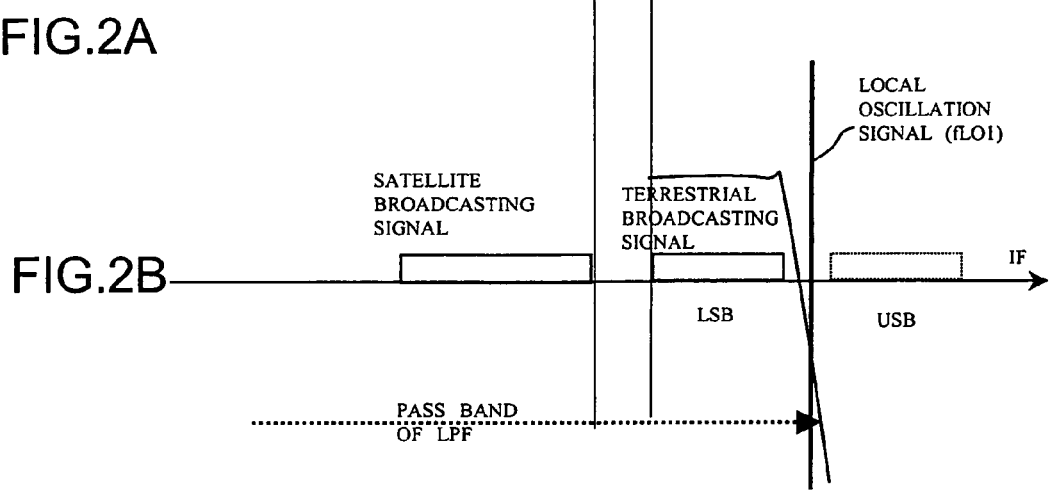

The terrestrial broadcasting signal of the UHF band input to input terminal 4 is applied to one input of a frequency mixer 6. The local oscillation signal of a local oscillation frequency fLO1 generated at a local oscillator 5 is applied to the other input of frequency mixer 6. As a result, the terrestrial broadcasting signal of the UHF band is frequency-converted to a high frequency band to be divided into a lower side band (LSB) and an upper side band (USB) as shown in FIG. 2B.

More specifically, local oscillation frequency fLO1 generated at local oscillator 5 is set higher than the frequency corresponding to a sum of the maximum frequency fBSH of the satellite broadcasting signal of the intermediate frequency band and the maximum frequency fUHFH of the terrestrial broadcasting signal of the UHF band. In other words, the following inequality is established.

$$fLO1 > fBSH + fUHFH \quad (1)$$

By converting the frequency of the terrestrial broadcasting signal using the set local oscillation frequency fLO1, the LSB of the terrestrial broadcasting signal whose frequency is converted is arranged adjacent the upper side of the frequency band of the satellite broadcasting signal. In order to carry out such frequency conversion, local oscillation frequency fLO1 is set to a frequency from a lower microwave band to a higher microwave band in the first embodiment.

Since the USB of the terrestrial broadcasting signal whose frequency is converted shown in FIG. 2B is not required in the present embodiment, only the desired LSB is extracted by a filter 7 that is a low pass filter or a band pass filter of FIG. 1A. The extracted signal is adjusted in level by an amplifier 8 and then applied to one input of a signal combiner 9. A satellite broadcasting signal of the intermediate frequency band is applied to the other input of signal combiner 9 via input terminal 21. As a result, the LSB of the terrestrial broadcasting signal whose frequency is converted is coupled with the satellite broadcasting signal. A multiplex signal wave having an arrangement on the frequency axis as shown in FIG. 2B is formed to be provided from frequency arranging circuit 1 to frequency up-converter 2.

Figure 2C:
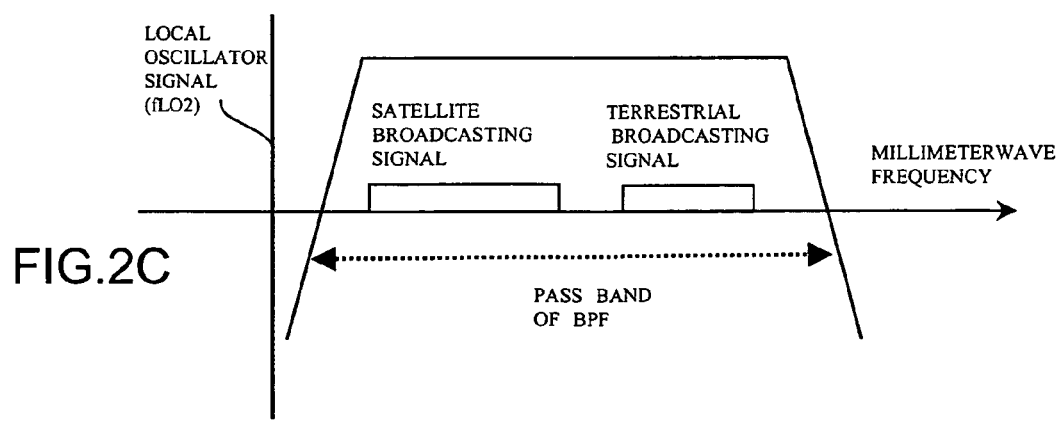

The multiplex signal wave applied to frequency up-converter 2 is adjusted in level by an intermediate frequency band amplifier 10, and then applied to one input of a frequency mixer 12. The local oscillation signal of a local oscillation frequency fLO2 generated at a local oscillator 11 is applied to the other input of frequency mixer 12. As a result, the multiplex signal wave from frequency arranging circuit 1 has the frequency converted to the millimeter wave band as shown in FIG. 2C by local oscillation frequency fLO2. A multiplex signal wave of the desired millimeter wave band is extracted by a filter 13 that is a low pass filter or a band pass filter to be applied to a radio frequency band amplifier 14. The millimeter wave band multiplex signal wave amplified by radio frequency band amplifier 14 is sent over the air via a transmission antenna 3.

Figure 1B:
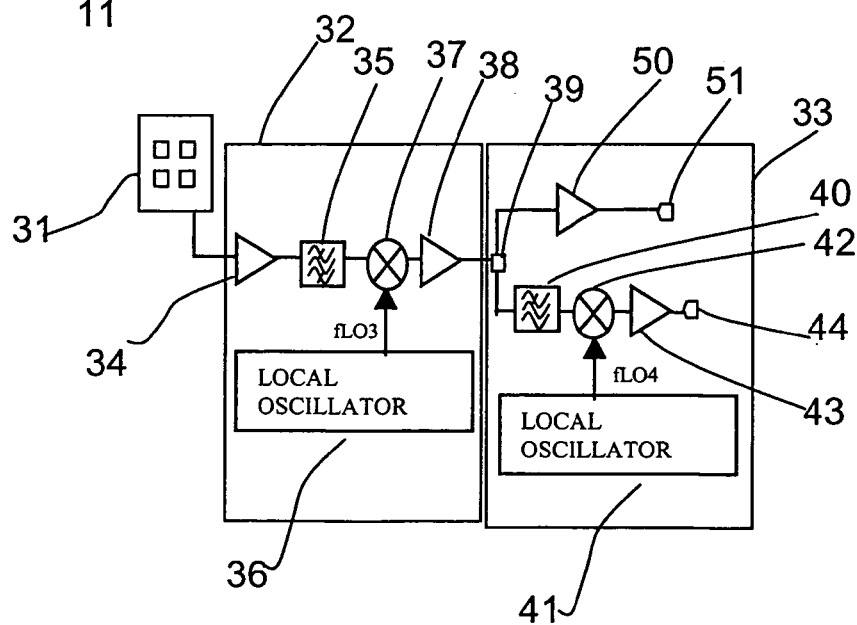
FIG. 1B is a schematic block diagram showing a millimeter wave band receiver forming the millimeter wave band communication apparatus of the first embodiment.

Referring to FIG. 1B, a millimeter wave band receiver according to the first embodiment of the present invention basically includes a frequency down-converter 32 and a frequency rearranging circuit 33.

A millimeter wave band multiplex signal wave received from the millimeter wave band transmitter of FIG. 1A via a reception antenna 31 is applied to frequency down-converter 32. The millimeter wave band multiplex signal wave applied to frequency down-converter 32 is first amplified by a low noise amplifier 34 to be applied to a band pass filter 35, whereby only the multiplex signal wave of the desired millimeter wave band is selected. The output of band pass filter 35 is applied to one input of a frequency mixer 37. A local oscillation signal of a local oscillation frequency fLO3 generated at a local oscillator 36 is applied to the other input of frequency mixer 37. Local oscillation frequency fLO3 of local oscillator 36 is equal to local oscillation frequency fLO2 of local oscillator 11 used in the up-conversion to the millimeter wave band in the millimeter wave band transmitter of FIG. 1A. In other words, the following equation is established.

$$fLO2 = fLO3 \quad (2)$$

As a result, the millimeter wave band multiplex signal wave extracted from band pass filter 35 is frequency-converted to the intermediate frequency band by local oscillation frequency fLO3 and amplified by an intermediate frequency band amplifier 38. The amplified wave is provided to frequency rearranging circuit 33 from frequency down-converter 32.

The multiplex signal wave of the intermediate frequency band input to frequency rearranging circuit 33 is applied to a signal distributor 39 to be divided into a satellite broadcasting signal and a terrestrial broadcasting signal. The satellite broadcasting signal is amplified and adjusted in level by an amplifier 50 which is a booster for satellite broadcasting. The processed signal is output via an output terminal 51 for a satellite broadcasting signal.

The terrestrial broadcasting signal has the unwanted signal of the higher frequency side removed by a filter 40 which is a low pass filter or a band pass filter to be applied to one input of a frequency mixer 42. A local oscillation signal of a local oscillation frequency fLO4 generated at local oscillator 41 is applied to the other input of frequency mixer 42. Here, local oscillation frequency fLO4 of local oscillator 41 is equal to local oscillation frequency fLO1 of local oscillator 5 of the millimeter wave band transmitter of FIG. 1A. In other words, the following equation is established.

$$fLO1=fLO4 \quad (3)$$

As a result, the terrestrial broadcasting signal of the intermediate frequency band extracted by filter 40 is converted into a terrestrial broadcasting signal of the UHF band. By the above equation (3), local oscillation frequency fLO4 of local oscillator 41 is also set to a frequency from a lower microwave band to a higher microwave band likewise local oscillation frequency fLO1.

The terrestrial broadcasting signal whose frequency is converted to the UHF band by frequency mixer 42 is amplified and adjusted in level by an amplifier 43 which is a booster for terrestrial broadcasting. The processed signal is output via an output terminal 44 for a terrestrial broadcasting signal.

According to the first embodiment of the present invention, the terrestrial broadcasting signal of the UHF band is first converted into a signal of a higher frequency band (intermediate frequency band) using a local oscillation frequency fLO1 which is a frequency from the sub-microwave band to the microwave band, followed by up-conversion to the millimeter wave band at the transmitter side and down-conversion from the millimeter wave band at the receiver side. Therefore, the abruptness of the characteristics of filter 13 in frequency up-converter 2 and filter 35 in frequency down-converter 32 can be alleviated. As a result, suppression is facilitated of the local oscillation signals of local oscillation frequencies fLO2 and fLO3 up-converted to the millimeter wave band, the image signal generated during up-conversion/down-conversion of the millimeter wave band signal and the like that are mixed into the millimeter wave band signal wave. Thus, millimeter wave band radio communication of high transmission efficiency and of low spurious generation is allowed.

(2) Second Embodiment

A millimeter wave band radio communication apparatus according to a second embodiment of the present invention will be described with reference to FIGS. 3A and 3B.

Figure 3A:
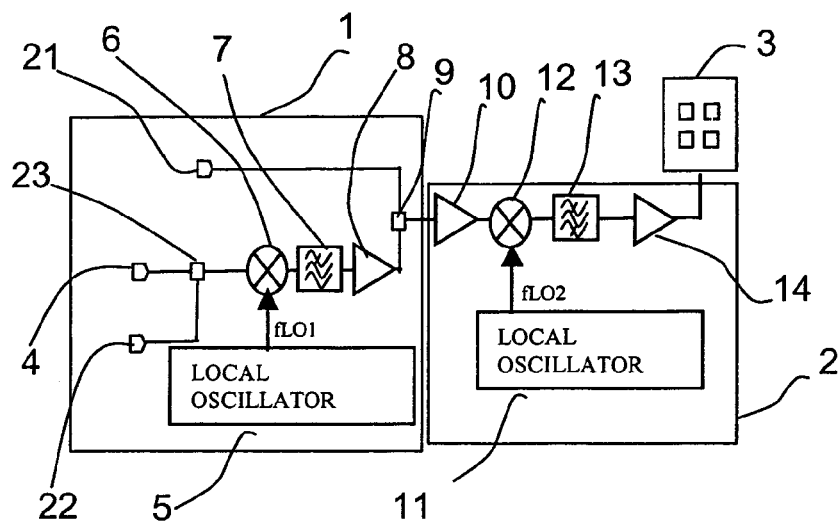
FIG. 3A is a schematic block diagram showing a millimeter wave band transmitter forming a millimeter wave band communication apparatus according to a second embodiment of the present invention.

The millimeter wave band transmitter of the second embodiment shown in FIG. 3A is similar to the millimeter wave band transmitter of the first embodiment shown in FIG. 1A except for the following points.

In contrast to the millimeter wave band transmitter of FIG. 1A in which a terrestrial broadcasting signal and a satellite broadcasting signal are applied to input terminals 4 and 21 as first and second modulation signal waves, respectively, the millimeter wave band transmitter of FIG. 3A also includes an input terminal 22 receiving a third modulation signal wave in frequency arranging circuit 1 in addition to the foregoing inputs.

More specifically, the second embodiment is described corresponding to the case where a terrestrial broadcasting signal is applied to input terminal 4 as a first modulation signal wave, a first satellite broadcasting signal is applied to input terminal 21 as a second modulation signal wave, and a second satellite broadcasting signal is applied to input terminal 22 as a third modulation signal wave, by way of example. FIG. 4A shows the arrangement of the input terrestrial broadcasting signal and first and second satellite broadcasting signals on the frequency axis. Here, the frequency bands of the first and second satellite broadcasting signals may overlap or not overlap with each other. In the example of FIG. 4A, the frequency bands of the first and second satellite broadcasting signals are partially overlapping with each other.

The terrestrial broadcasting signal input to input terminal 4 and the second satellite broadcasting signal input to input terminal 22 are added and multiplexed by signal combiner 23. The first multiplex signal wave of the terrestrial broadcasting signal and the second satellite broadcasting signal is applied to one input of frequency mixer 6. A local oscillation signal of local oscillation frequency fLO1 generated at local oscillator 5 is applied to the other input of frequency mixer 6. As a result, the first multiplex signal wave of the terrestrial broadcasting signal and the second satellite broadcasting signal is frequency-converted to a higher frequency band and divided into the LSB and the USB as shown in FIG. 4B.

Since the frequency band of the terrestrial broadcasting signal and the frequency band of the second satellite broadcasting signal are independent of each other and since the frequency band of the second satellite broadcasting signal is higher than the frequency band of the terrestrial broadcasting signal, respective frequency bands of the first satellite broadcasting signal, the terrestrial broadcasting signal and the second satellite broadcasting signal are arranged in this order on the frequency axis as shown in FIG. 4B as a result of frequency conversion by frequency mixer 6.

More specifically, local oscillation frequency fLO1 generated at local oscillator 5 is set higher than the frequency corresponding to a sum of the maximum frequency fBSH1 of the first satellite broadcasting signal of the intermediate frequency band and the maximum frequency fCSH1 of the second satellite broadcasting signal of the intermediate frequency band. In other words, the following inequality is established, provided that the maximum frequency fBSH1 of the first satellite broadcasting signal is higher than the maximum frequency fUHF1 of the terrestrial broadcasting signal (fUHF1<fBSH1).

$$fLO1>FBSH1+fCSH1 \quad (4)$$

Conversely, when fUHF1>fBSH1, fLO1 is set so as to satisfy the relationship of:

$$fLO1>fUHF1+fCHF1 \quad (5)$$

By frequency-converting the first multiplex signal of the terrestrial broadcasting signal and the second satellite broadcasting signal using a local oscillation frequency fLO1 set as in the above equation (4) or (5), the LSB of the terrestrial broadcasting signal and the second satellite broadcasting signal whose frequency are converted is arranged adjacent to the higher frequency side of the frequency band of the first satellite broadcasting signal. In order to carry out such frequency conversion, local oscillation frequency fLO1 is set to a frequency from a lower microwave band to a higher microwave band in the second embodiment.

Since the USB of the first multiplex signal corresponding to the terrestrial broadcasting signal and the second satellite broadcasting signal whose frequency are converted shown in FIG. 4B is an unwanted signal in the present embodiment, only the desired LSB is extracted by filter 7 which is a low pass filter or a band pass filter of FIG. 3A. The extracted signal is level-adjusted by amplifier 8 and then applied to one input of signal combiner 9. The first satellite broadcasting signal is applied to the other input of signal combiner 9 via input terminal 21. As a result, the LSB of the first multiplex signal wave corresponding to the terrestrial broadcasting signal and the second satellite broadcasting signal whose frequency are converted is coupled with the first satellite broadcasting signal, whereby a second multiplex signal wave having the arrangement on the frequency axis as shown in FIG. 4B is formed. This second multiplex signal wave is provided from frequency arranging circuit 1 to frequency up-converter 2.

The multiplex signal wave applied to frequency up-converter 2 is level-adjusted by intermediate frequency band amplifier 10 and then applied to one input of frequency mixer 12. The local oscillation signal of local oscillation frequency fLO2 generated at local oscillator 11 is applied to the other input of frequency mixer 12. As a result, the second multiplex signal wave input from frequency arranging circuit 1 is frequency-converted to the millimeter wave band as shown in FIG. 4C by local oscillation frequency fLO2. A multiplex signal wave of the desired millimeter wave band is extracted from filter 13 which is a low pass filter or band pass filter to be applied to radio frequency amplifier 14. The millimeter wave band multiplex signal wave amplified by radio frequency band amplifier 14 is sent through the air via transmission antenna 3.

Figure 3B:
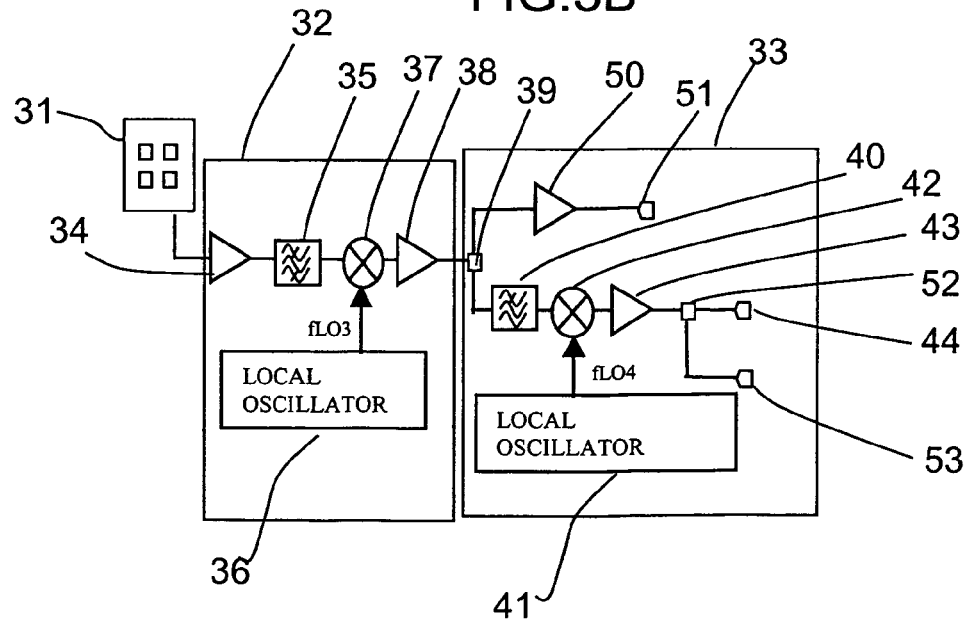
FIG. 3B is a schematic block diagram showing a millimeter wave band receiver forming the millimeter wave band communication apparatus of the second embodiment.

Referring to FIG. 3B, a millimeter wave band receiver according to the second embodiment is similar to the millimeter wave band receiver of the first embodiment shown in FIG. 1B, provided that an output terminal 53 to provide a third modulation signal wave (second satellite broadcasting signal) is provided in frequency rearranging circuit 33.

The millimeter wave band multiplex signal wave received via reception antenna 31 from the millimeter wave band transmitter of FIG. 3A is applied to frequency down-converter 32. The millimeter wave band multiplex signal wave applied to frequency down-converter 32 is amplified by low noise amplifier 34 and then applied to band pass filter 35. Only the second multiplex signal wave of the desired millimeter wave band is selected. The output of band pass filter 35 is applied to one input of frequency mixer 37. The local oscillation signal of local oscillation frequency fLO3 generated at local oscillator 36 is applied to the other input of frequency mixer 37. Here, local oscillation frequency fLO3 of local oscillator 36 is equal to local oscillation frequency fLO2 of local oscillator 11 employed in the up-conversion to the millimeter wave band in the transmitter of FIG. 3A. In other words, the following equation is established.

$$fLO2=fLO3 \quad (6)$$

As a result, the millimeter wave band multiplex signal wave extracted by band pass filter 35 is frequency-converted to the intermediate frequency band by local oscillation frequency fLO3 and amplified by intermediate frequency band amplifier 38. The amplified signal is provided from frequency down-converter 32 to frequency rearranging circuit 33.

The second multiplex signal wave of the intermediate frequency band applied to frequency rearranging circuit 33 is provided to signal distributor 39 to be divided into the first satellite broadcasting signal and the first multiplex signal wave corresponding to the terrestrial broadcasting signal and the second satellite broadcasting signal. The first satellite broadcasting signal is amplified and adjusted in level by an amplifier 50 which is the booster for satellite broadcasting. The processed signal is provided via output terminal 51 for the first satellite broadcasting signal.

The first multiplex signal wave has the unwanted signal of the higher frequency side removed by filter 40 which is a low pass filter or a band pass filter, and then applied to one input of frequency mixer 42. The local oscillation signal of local oscillation frequency fLO4 generated at local oscillator 41 is applied to the other input of frequency mixer 42. Here, local oscillation frequency fLO4 of local oscillator 41 is equal to local oscillation frequency fLO1 of local oscillator 5 of the millimeter wave band transmitter of FIG. 3A. In other words, the following equation is established.

$$fLO1=fLO4 \quad (7)$$

As a result, the terrestrial broadcasting signal and the second satellite broadcasting signal forming the first multiplex signal wave extracted by filter 40 are respectively converted into the terrestrial broadcasting signal of the UHF band and the second satellite broadcasting signal of the intermediate frequency band.

The first multiplex signal wave whose frequency is converted by frequency mixer 42 is amplified and level-adjusted by amplifier 43. The processed signal is divided into the terrestrial broadcasting signal and the second satellite broadcasting signal by second signal distributor 52. The terrestrial broadcasting signal is output via output terminal 44 whereas the second satellite broadcasting signal is output via output terminal 53.

By converting the frequency of one input modulation signal wave using local oscillation frequency fLO1 which is from a lower microwave band to a higher microwave band, even if the frequency bands of two input modulation signal waves (first and second satellite broadcasting signals) overlap each other as shown in FIG. 4A, the two frequency bands can be arranged on the frequency axis independent of each other in the second embodiment of the present invention. Therefore, the multiplexed signal can be transmitted at one time at the millimeter wave band having a wide band characteristic.

Figure 14:
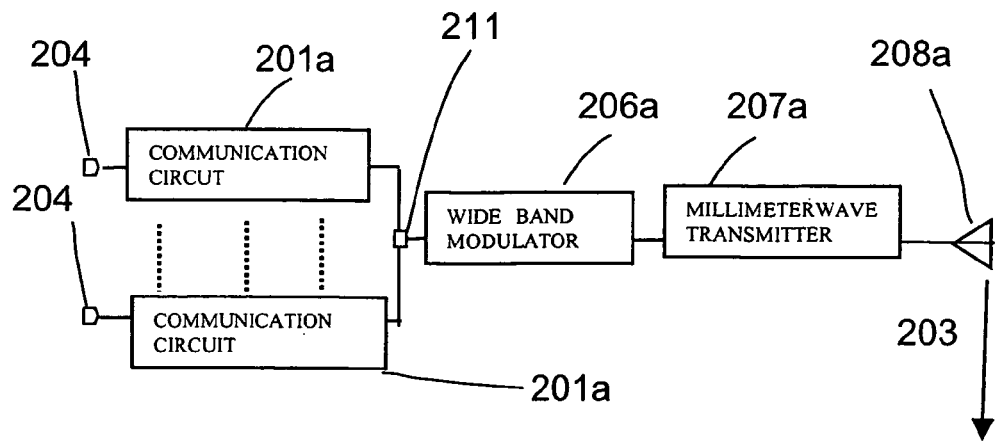
FIG. 14 is a schematic block diagram of a transmitter of another conventional millimeter wave band radio communication apparatus.

Differing from the conventional millimeter wave band transmitter of FIG. 14 in which a plurality of signals are multiplexed using an adder, frequency conversion is carried out using a frequency mixer which is a multiplier according to the second embodiment. Therefore, signals overlapping in frequency band can be separated on the frequency axis and transmitted in a multiplexed fashion.

Furthermore, by converting the frequency of the first multiplex signal wave using a local oscillation frequency fLO1 from a lower microwave band to a higher microwave band and employing only the LSB of the converted signal, local oscillation frequency fLO1 can be set high. Also, fLO4 equal to fLO1 can be set high.

During up-conversion to the millimeter wave band or down-conversion from the millimeter wave band, the local oscillation signals of the highly set local oscillation frequencies appear as spurious signals located apart on the frequency axis from the local oscillation signals of local oscillation frequencies fLO2 and fLO3 up-converted to the millimeter wave band. Therefore, these spurious signals can be easily suppressed using filters 13 and 14 which are low pass filters or band pass filters.

In general, the number of components is increased to result in a larger circuit in order to realize an abrupt band pass filter of a wide range in the UHF band. Therefore, the second embodiment of the present invention is advantageous in that a plurality of modulation signal waves can be multiplexed efficiently without having to use large band pass filters.

(3) Third Embodiment

There is the case where the first modulation signal wave (terrestrial broadcasting signal) restored and output by the receiver cannot be demodulated by a tuner and a demodulator of the proceeding stage (not shown) if the stability of local oscillation frequencies fLO1 and fLO4 of local oscillators 5 and 41 is low in the millimeter wave band communication apparatus of the first and second embodiments.

The third embodiment of the present invention is directed to improve stability of local oscillation frequencies fLO1 and fLO4 of local oscillators 5 and 41 to restore the first modulation signal wave output from output terminal 44 at high accuracy.

A millimeter wave band radio communication apparatus according to the third embodiment of the present invention will be described with reference to FIGS. 5A and 5B.

Figure 5A:
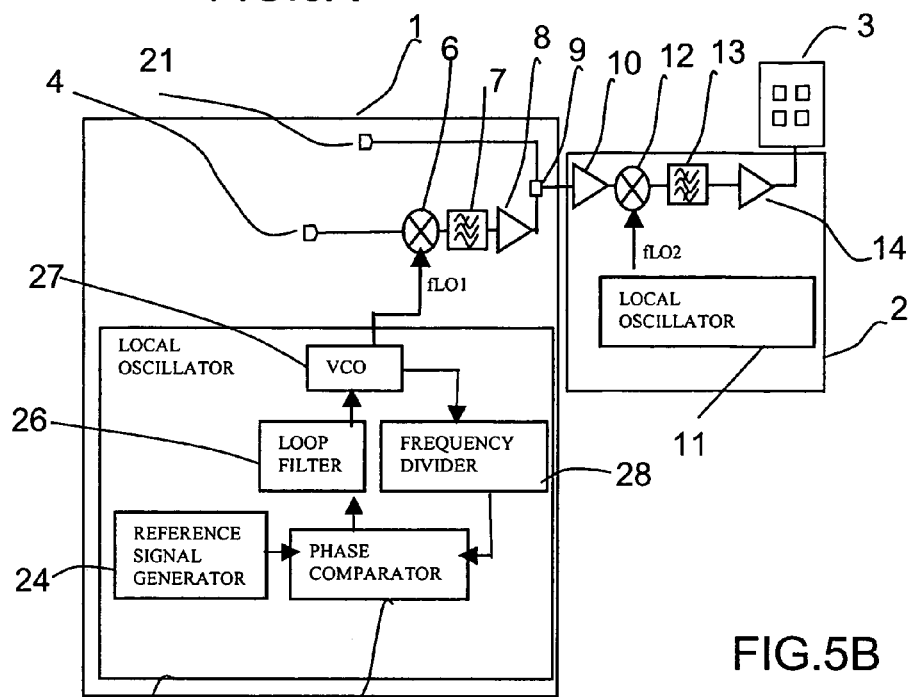
FIG. 5A is a schematic block diagram showing a millimeter wave band transmitter forming a millimeter wave band communication apparatus according to a third embodiment of the present invention.

The millimeter wave band transmitter of the third embodiment shown in FIG. 5A is similar to the millimeter wave band transmitter of the first embodiment shown in FIG. 1A, provided that local oscillator 5 has an internal structure as shown in FIG. 5A. Referring to FIG. 5A, local oscillator 5 of the millimeter wave band transmitter of the third embodiment is configured as a phase lock oscillator employing, for example, a crystal oscillator or rubidium oscillator having a high frequency accuracy as a reference signal source 24.

The signal output from reference signal source 24 and the signal output from a voltage control oscillator (VCO) 27 divided in frequency by a frequency divider 28 are compared in frequency and phase by a phase comparator 25 in local oscillator 5. As a result, an error signal associated with the frequency and phase is applied to the control input of VCO 27 via a loop filter 26, whereby VCO 27 is driven. VCO 27 responds to the control input to generate and output a local oscillation signal of local oscillation frequency fLO1.

Figure 6A:
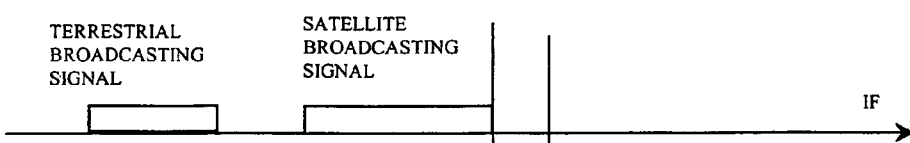
FIGS. 6A, 6B and 6C represent the frequency spectrum of the millimeter wave band communication apparatus of the third embodiment.
Figure 6B:
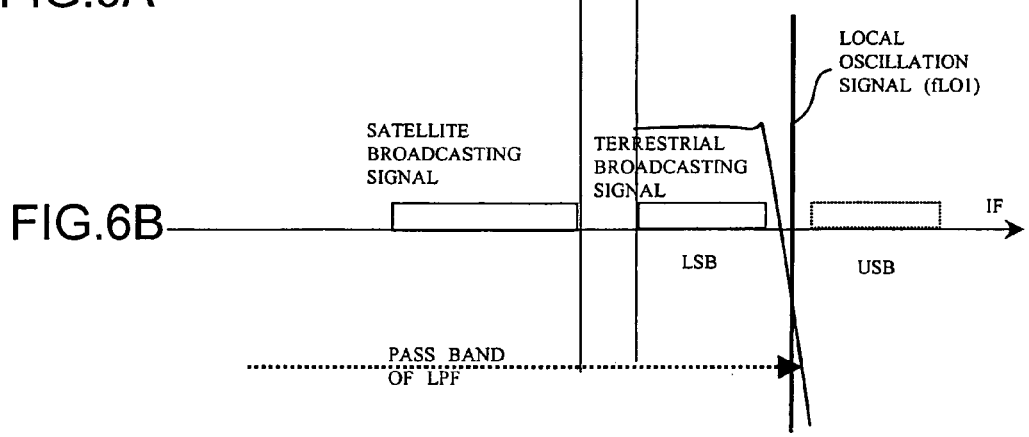

As already described in relation to the first embodiment, the terrestrial broadcasting signal applied to frequency mixer 6 through input terminal 4 is converted in frequency by the local oscillation signal of local oscillation frequency fLO1 from local oscillator 5, and the output of frequency mixer 6 is applied to filter 7 that is a low pass filter or a band pass filter. As shown in FIG. 6B, filter 7 has the function to partially pass the power of the local oscillation signal of local oscillation frequency fLO1 included in the output of frequency mixer 6.

Figure 6C:
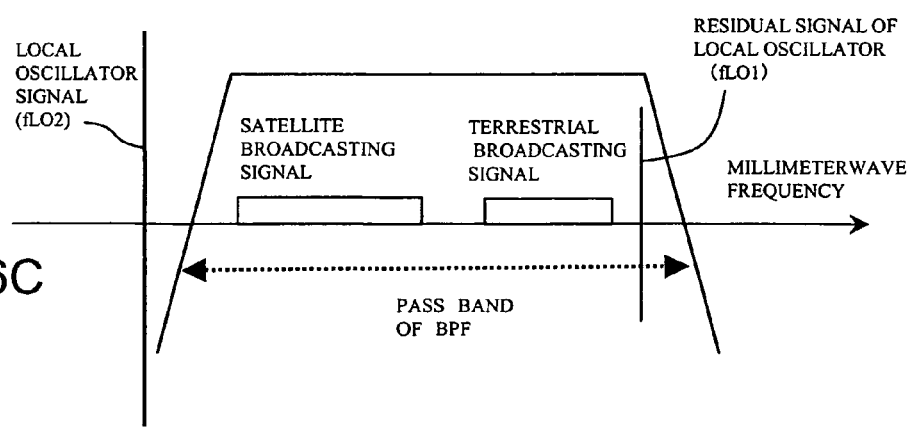

The output of filter 7 is coupled with the satellite broadcasting signal applied from input terminal 21 by signal combiner 9 to be applied to frequency up-converter 2 for up-conversion to the millimeter wave band. At this stage, a portion of the signal power of local oscillation frequency fLO1 is also up-converted to the millimeter wave band to remain in the millimeter wave band multiplex signal wave as shown in FIG. 6C.

Figure 5B:
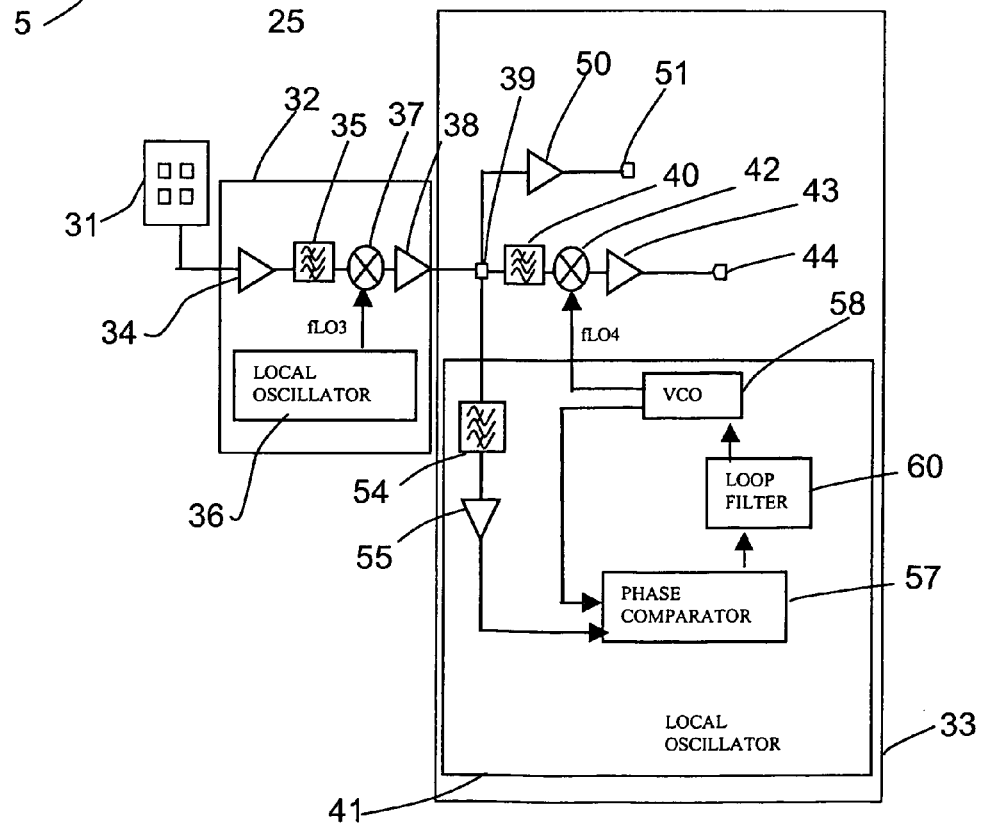
FIG. 5B is a schematic block diagram showing a millimeter wave band receiver forming the millimeter wave band communication apparatus of the third embodiment.

The millimeter wave band receiver of the third embodiment shown in FIG. 5B is similar to the millimeter wave band receiver of the first embodiment shown in FIG. 1A, provided that local oscillator 41 has an internal structure as shown in FIG. 5B.

Referring to FIG. 5B, the signal output from frequency down-converter 32 is applied to band pass filter 54 via signal distributor 39. Band pass filter 54 extracts the local oscillation signal component of local oscillation frequency fLO1 present in the received signal. The extracted signal component is applied to amplifier 55 to have the level adjusted. The signal component of local oscillation frequency fLO1 is adjusted in level by amplifier 55. The output frequency of amplifier 55 and the output signal of VCO 58 are compared in frequency and phase by a phase comparator 57. Accordingly, an error signal associated with the frequency and phase is applied to a loop filter 60. Only the low frequency component is extracted and applied to the control input of VCO 58, whereby VCO 58 is driven.

As a result, VCO 58 generates a local oscillation signal of local oscillation frequency fLO4 in synchronization with the frequency and phase of the local oscillation signal of local oscillation frequency fLO1 output from local oscillator 5 of the transmitter side. The generated local oscillation signal is applied to frequency mixer 42 as the output of local oscillator 41.

According to the third embodiment, the local oscillation signal of local oscillation frequency fLO1 of local oscillator 5 at the transmitter side is set in synchronization in frequency and phase with the local oscillation signal of local oscillation frequency fLO4 of local oscillator 41 at the receiver side. Therefore, the restored modulation signal wave output from output terminal 44 of the millimeter wave band receiver can be output having a frequency of stable accuracy substantially equal to that of the modulation signal wave applied to the input terminal of the millimeter wave band transmitter even if the frequency stability of the other local oscillators 11 and 36 is somewhat poor. Thus, stable millimeter wave band radio transmission is allowed in transmitting a modulation signal wave required of high frequency stability such as a terrestrial broadcasting signal.

(4) Fourth Embodiment

A millimeter wave band radio communication apparatus according to a fourth embodiment of the present invention will be described with reference to FIGS. 7A and 7B.

Figure 7A:
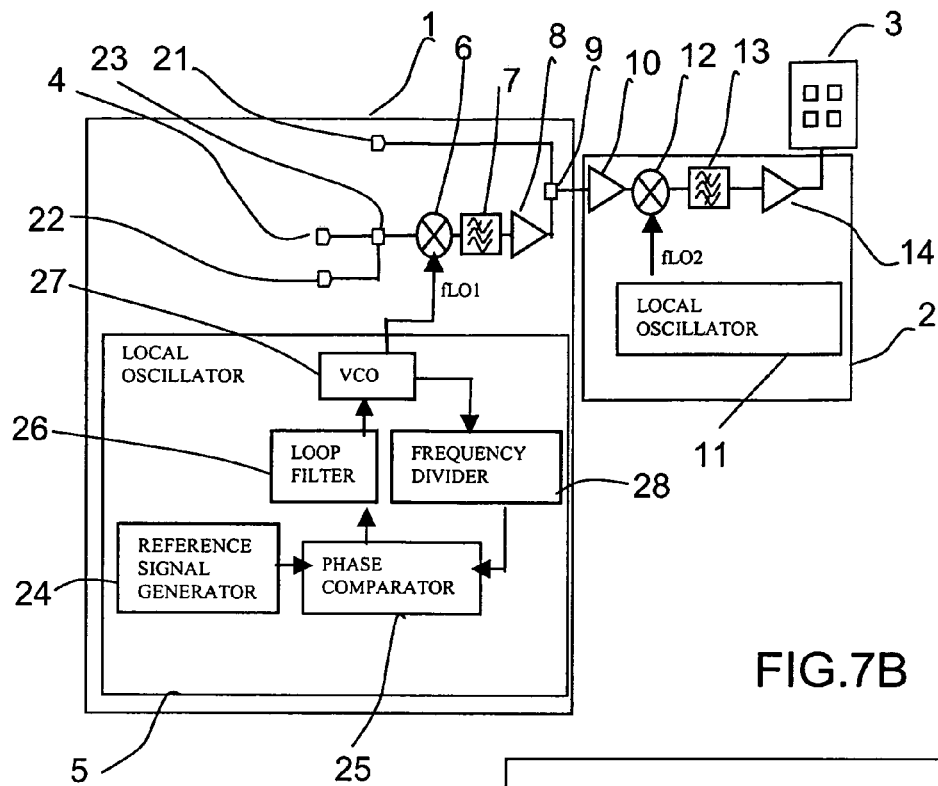
FIG. 7A is a schematic block diagram showing a millimeter wave band transmitter forming a millimeter wave band communication apparatus according to a fourth embodiment of the present invention.
Figure 7B:
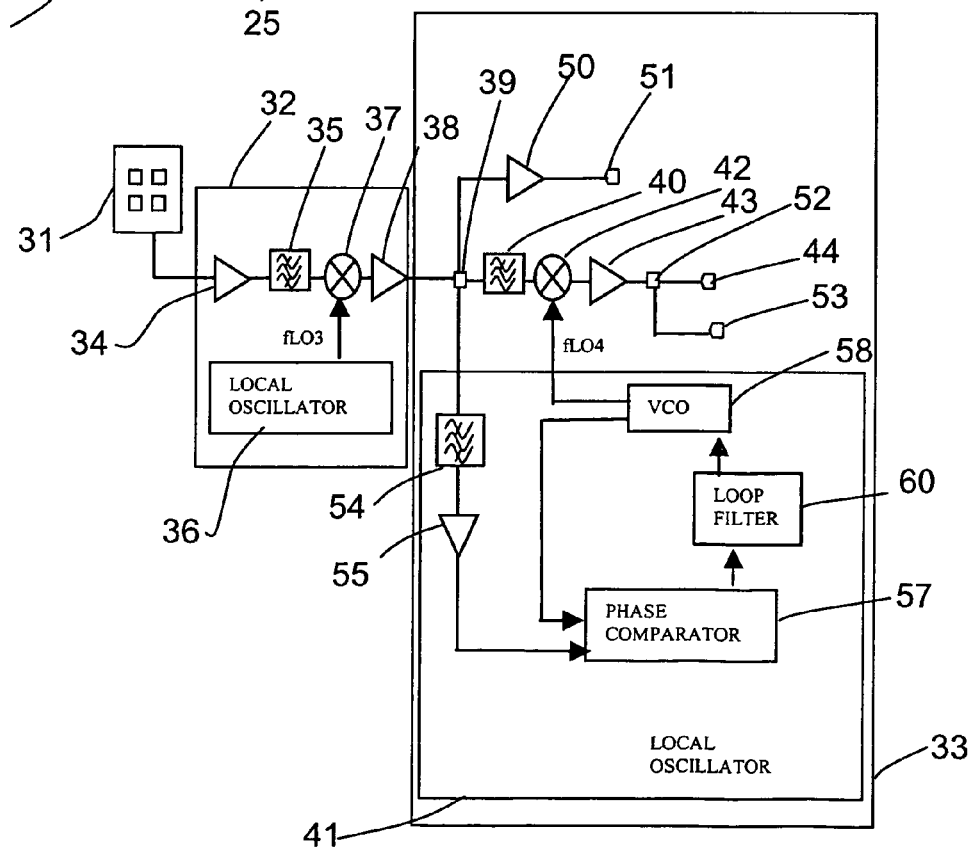
FIG. 7B is a schematic block diagram showing a millimeter wave band receiver forming the millimeter wave band communication apparatus of the fourth embodiment.

The fourth embodiment of FIGS. 7A and 7B has the structure of the third embodiment applied to the millimeter wave band radio communication apparatus of the second embodiment having three modulation signal wave inputs shown in FIGS. 3A and 3B.

More specifically, local oscillator 5 of the millimeter wave band transmitter of the fourth embodiment shown in FIG. 7A has a structure identical to local oscillator 5 of the millimeter wave band transmitter of the third embodiment shown in FIG. 5A. Therefore, description of the structure of local oscillator 5 will not be repeated.

Figure 8A:
FIGS. 8A, 8B and 8C represent the frequency spectrum of the millimeter wave band communication apparatus according to a fourth embodiment of the present invention.
Figure 8B:
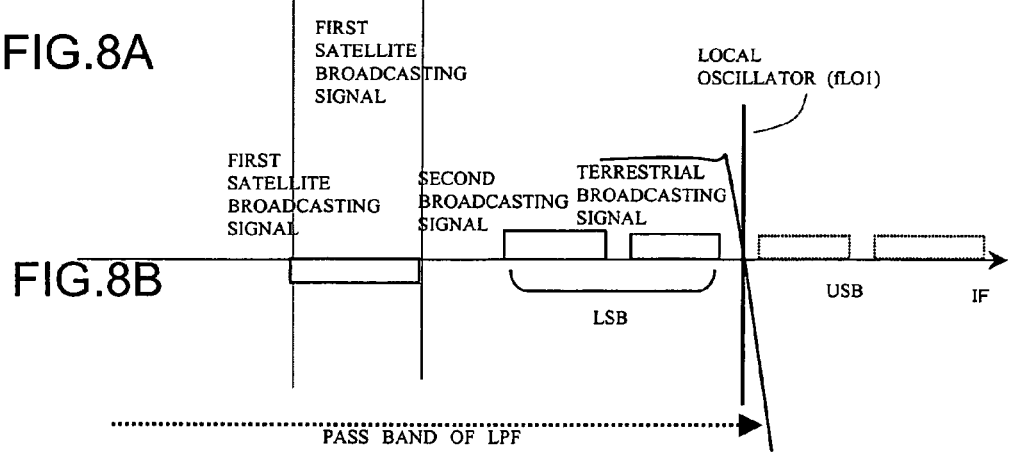
Figure 8C:
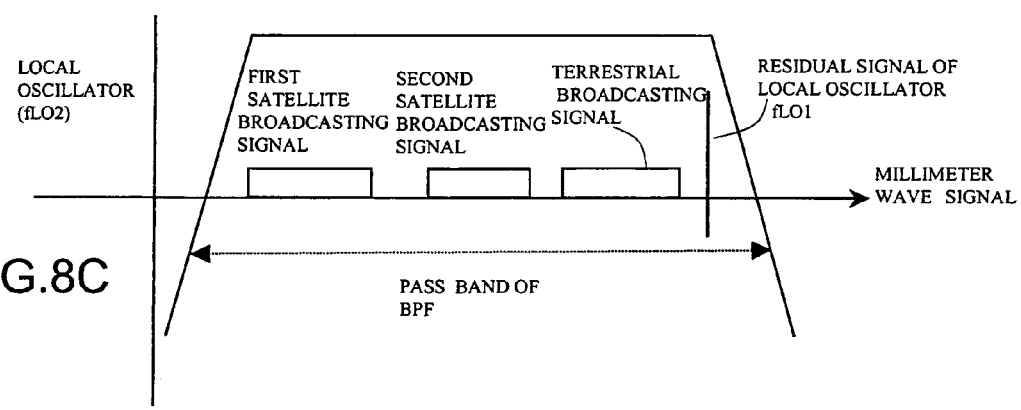

As described in relation with FIG. 5A, filter 7 of frequency arranging circuit 1 partially passes the signal power of local oscillation frequency fLO1, as shown in FIG. 8B. Therefore, the signal component corresponding to the up-converted version of the local oscillation signal of local oscillation frequency fLO1 to the millimeter wave band remains in the millimeter wave band multiplex signal wave generated at frequency up-converter 2, as shown in FIG. 8C.

Local oscillator 41 of the millimeter wave band receiver of the fourth embodiment shown in FIG. 7B has a structure identical to that of local oscillator 41 of the millimeter wave band receiver of the third embodiment shown in FIG. 5B. Therefore, description of the structure of local oscillator 41 will not be repeated.

As described in relation with FIG. 5B, the remaining signal component of local oscillation frequency fLO1 is extracted by filter 54 in local oscillator 41 from the received multiplex signal wave that is down-converted from the millimeter wave band by frequency down-converter 32 and applied to frequency divider 56. As a result, local oscillator 41 generates a local oscillation signal of local oscillation frequency fLO4 synchronizing in frequency and phase with local oscillation frequency fLO1 of the transmitter side. The generated local oscillation signal is used in frequency-conversion by frequency mixer 42.

Therefore, the restored modulation signal wave from output terminals 44 and 53 of the millimeter wave band receiver can be output at a frequency stability accuracy substantially equal to that of the corresponding modulation signal wave applied to the input terminal of the millimeter wave band transmitter even if the frequency stability of the other oscillators 11 and 36 is somewhat poor.

(5) Fifth Embodiment

In the previous third and fourth embodiments, synchronization is established between local oscillation frequency fLO1 of the transmitter side and local oscillation frequency fLO4 of the receiver side. Therefore, a modulation signal wave is reproduced at a frequency stability substantially equal to that of the input of frequency mixer 6 at the input side from frequency mixer 42 at the output side.

However, if the stable accuracy of the local oscillation frequencies of local oscillators 11 and 36 is low, frequency deviation will occur in the first satellite broadcasting signal which is the second modulation signal wave output from output terminal 51. This disables output of high frequency accuracy.

The fifth embodiment of the present invention is directed to improve the frequency stability of local oscillation frequencies fLO2 and fLO3 of local oscillators 11 and 36 to restore all modulation signal waves at high accuracy.

A millimeter wave band communication apparatus according to the fifth embodiment of the present invention will be described hereinafter with reference to FIGS. 9A and 9B.

Figure 9A:
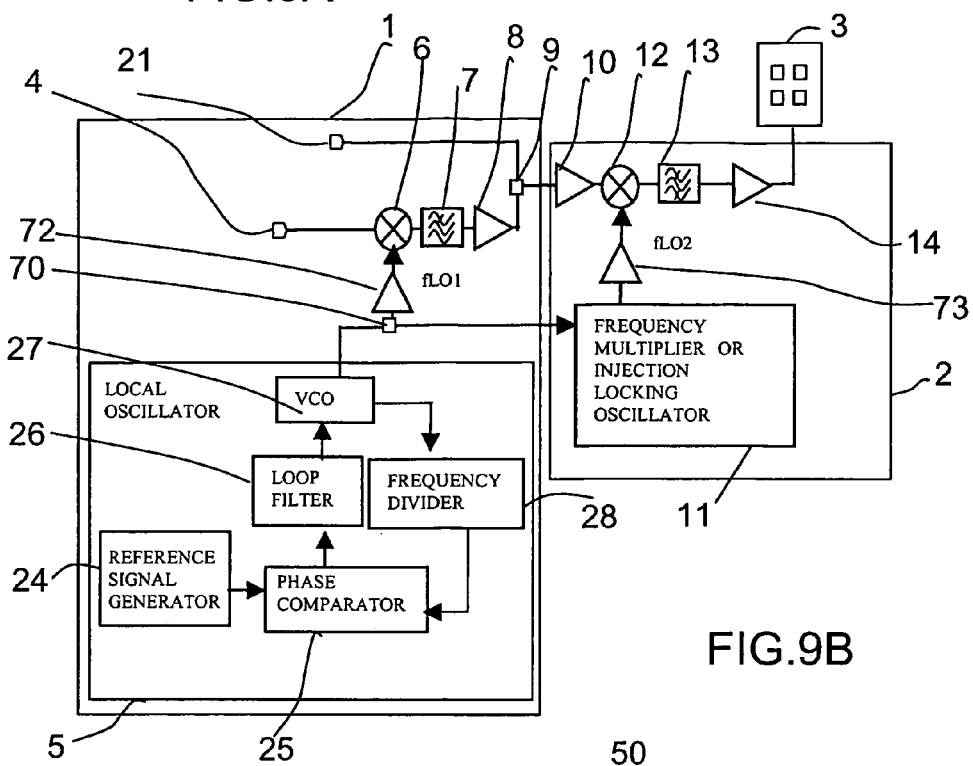
FIG. 9A is a schematic block diagram showing a millimeter wave band transmitter forming a millimeter wave band communication apparatus according to a fifth embodiment of the present invention.

The millimeter wave band transmitter according to the fifth embodiment shown in FIG. 9A is similar to the millimeter wave band transmitter of the third embodiment shown in FIG. 5A except for the following points.

Local oscillator 11 of frequency up-converter 2 is configured using a frequency multiplier or an injection locking oscillator. Also, the local oscillation signal of local oscillation frequency fLO1 output from local oscillator 5 of frequency arranging circuit 1 is divided into two at signal distributor 70. One is amplified by amplifier 72 to be applied as the local oscillation input of frequency mixer 6 whereas the other is injected to local oscillator 11 which is a frequency multiplier or an injection locking oscillator.

More specifically, the local oscillation signal of local oscillation frequency fLO1 from local oscillator 5 becomes the injection locking source of local oscillator 11. Local oscillator 11 is now allowed to generate a local oscillation signal of local oscillation frequency fLO2 at a frequency stability of a level similar to that of local oscillator 5. The generated local oscillation signal of local oscillation frequency fLO2 is amplified by amplifier 73 to be applied as the local oscillation input of frequency mixer 12.

Figure 9B:
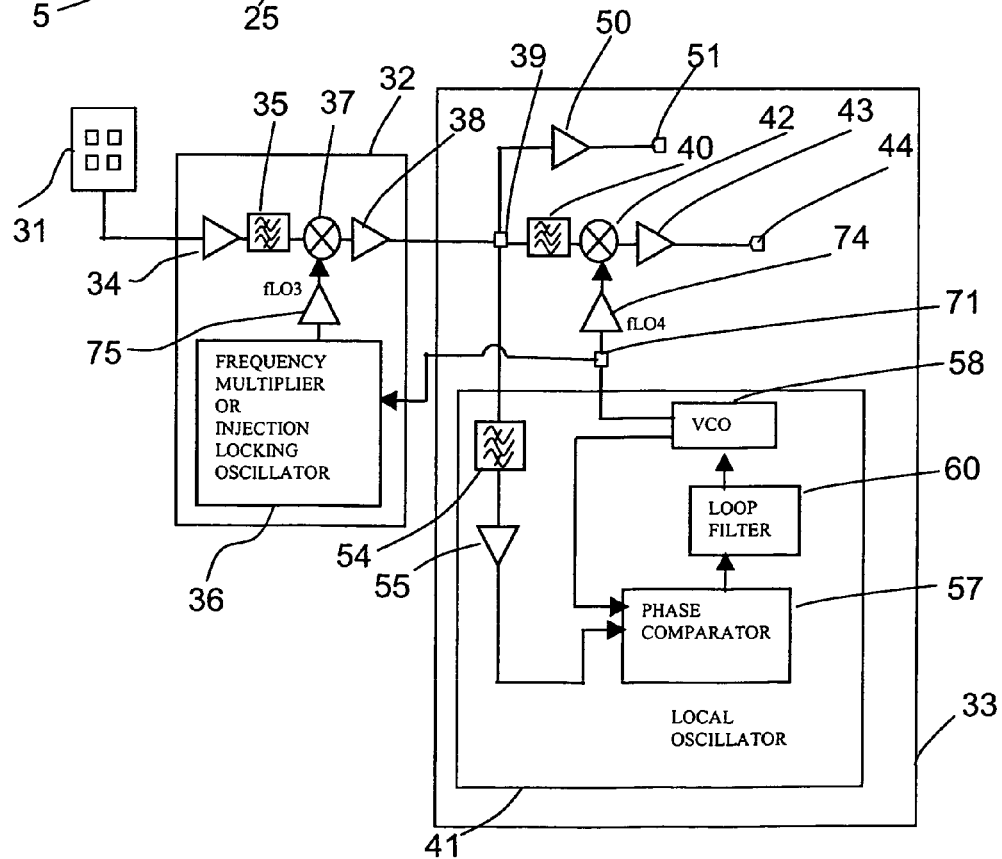
FIG. 9B is a schematic block diagram showing a millimeter wave band receiver forming the millimeter wave band communication apparatus of the fifth embodiment.

The millimeter wave band receiver of the fifth embodiment shown in FIG. 9B is similar to the millimeter wave band receiver of the third embodiment shown in FIG. 5B except for the following points.

Local oscillator 36 of frequency down-converter 32 is configured using a frequency multiplier or an injection locking oscillator. The local oscillation signal of local oscillation frequency fLO4 output from local oscillator 41 of frequency rearranging circuit 33 is divided into two by signal distributor 71. One is amplified by amplifier 74 and then applied as the local oscillation input of frequency mixer 42 whereas the other is injected to local oscillator 36 which is a frequency multiplier or an injection locking oscillator.

More specifically, the local oscillation signal of local oscillation frequency fLO4 from local oscillator 41 becomes the injection locking source of local oscillator 36. Local oscillator 36 can now generate a local oscillation signal of local oscillation frequency fLO3 at a frequency stability of a level similar to that of local oscillator 41. The generated local oscillation signal of local oscillation frequency fLO3 is amplified by amplifier 75, and then applied as the local oscillation input of frequency mixer 37.

By virtue of the usage of an n-order (n: integer) harmonic mixer or a frequency mixer having the frequency multiply function for frequency mixer 12 of the transmitter side and frequency mixer 37 of the receiver side, the local oscillation signals of local oscillation frequencies fLO2 and fLO3 of local oscillators 11 and 16 do not have to be local oscillation signals of the millimeter wave band. The local oscillation frequencies respectively become 1/n.

Accordingly, the multiple order p (p: integer) of the frequency multiplier or the sub harmonic order m (m: integer) injected to the injection locking oscillator used in local oscillators 11 and 36 or the harmonic order k (k: integer) of the output signal can be reduced. As a result, the signal frequency of the junction of local oscillators 11 and 36 and frequency mixers 12 and 37 respectively become lower to provide the advantage of facilitating connection.

Further preferably, usage of an antiparallel type diode frequency mixer which is a harmonic mixer for frequency mixers 12 and 37 provides the advantage of suppressing the harmonic spurious components of the local oscillation signals of local oscillation frequencies fLO2 and fLO3 leaking from frequency mixers 12 and 37 in addition to the aforementioned advantage.

(6) Sixth Embodiment

A millimeter wave band radio communication apparatus according to a sixth embodiment of the present invention will be described hereinafter with reference to FIGS. 10A and 10B.

Figure 10A:
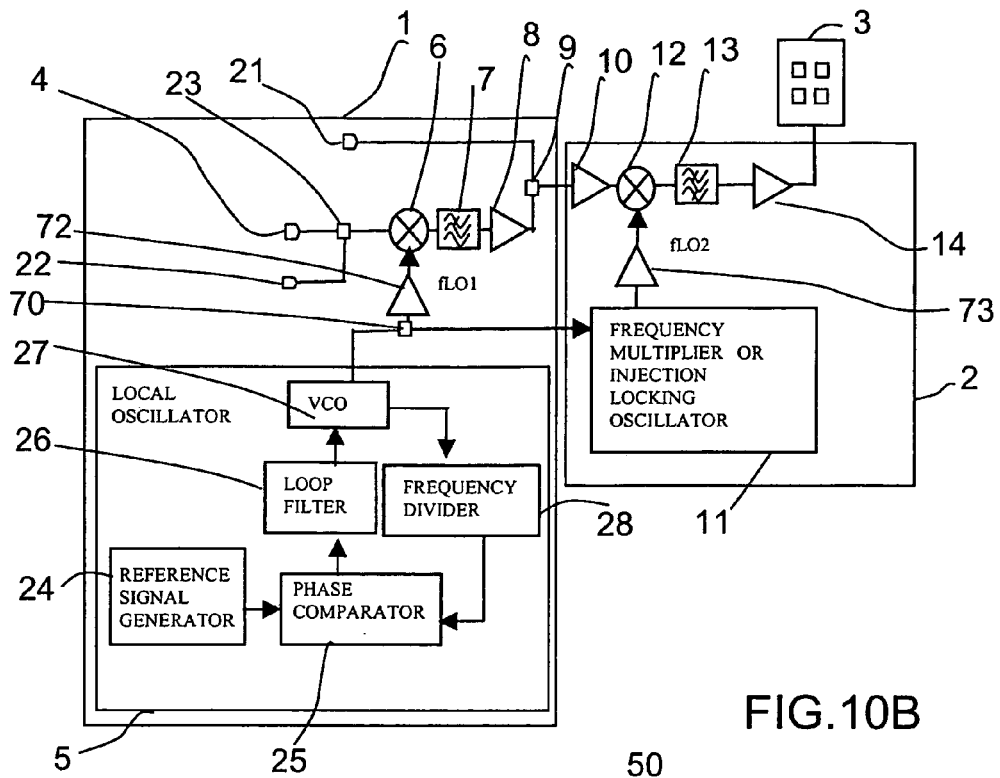
FIG. 10A is a schematic block diagram showing a millimeter wave band transmitter forming a millimeter wave band communication apparatus according to a sixth embodiment of the present invention.
Figure 10B:
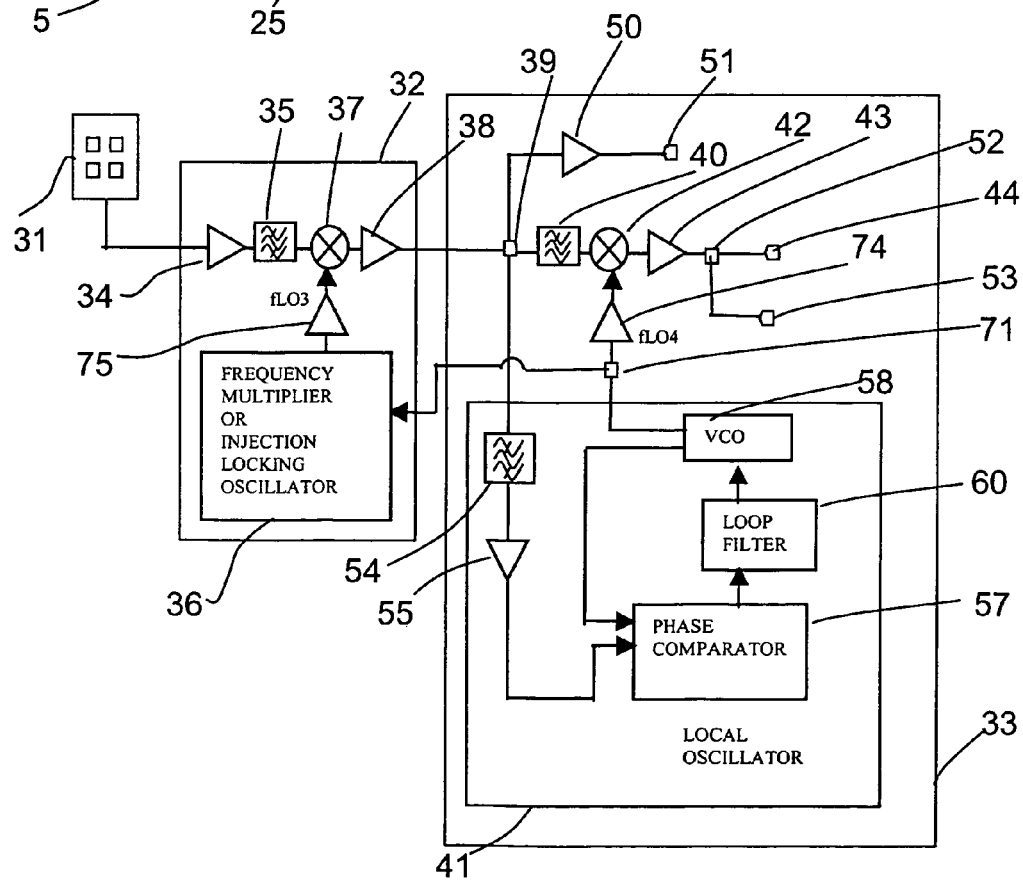
FIG. 10B is a schematic block diagram showing a millimeter wave band receiver forming the millimeter wave band communication apparatus of the sixth embodiment.

The sixth embodiment of FIGS. 10A and 10B has the structure of the fifth embodiment applied to the millimeter wave band communication apparatus of the fourth embodiment having three modulation signal wave inputs shown in FIGS. 7A and 7B.

In the millimeter wave band transmitter of the sixth embodiment shown in FIG. 10A, local oscillator 11 is configured by a frequency multiplier or an injection locking oscillator. The local oscillation signal of local oscillation frequency fLO1 in local oscillator 5 is used as an injection locking source. In the millimeter wave band receiver of the sixth embodiment shown in FIG. 10B, local oscillator 36 is configured by a frequency multiplier or an injection locking oscillator. The local oscillation signal of local oscillation frequency fLO4 in local oscillator 41 is employed as the injection locking source.

The function and advantage according to such a structure are similar to those described in detail with reference to the fifth embodiment. Therefore, description thereof will not be repeated.

(7) Seventh Embodiment

In the previous third to sixth embodiments, a portion of the local oscillation signal of local oscillation frequency fLO1 generated at local oscillator 5 at the transmitter side is made to remain in the millimeter wave band multiplex signal wave, which is used for synchronization with local oscillator 41 at the receiver side in frequency and phase.

However, there is a possibility that the power of transmission information originally required such as data and video information will be reduced by the remaining local oscillation signal components to shorten the radio transmission distance from the viewpoint of the power components of the transmission signal.

The seventh embodiment of the present invention is directed to completely remove the local oscillation signal of local oscillation frequency fLO1 generated in local oscillator 5 at the transmitter side by filter 7 at the transmitter side. Also, local oscillator 41 of the millimeter wave band receiver side is configured as a phase lock oscillator employing, for example, a crystal oscillator or a rubidium oscillator as a reference signal source 61.

The millimeter wave band communication apparatus of the seventh embodiment will be described here with reference to FIGS. 11A and 11B.

Figure 11A:
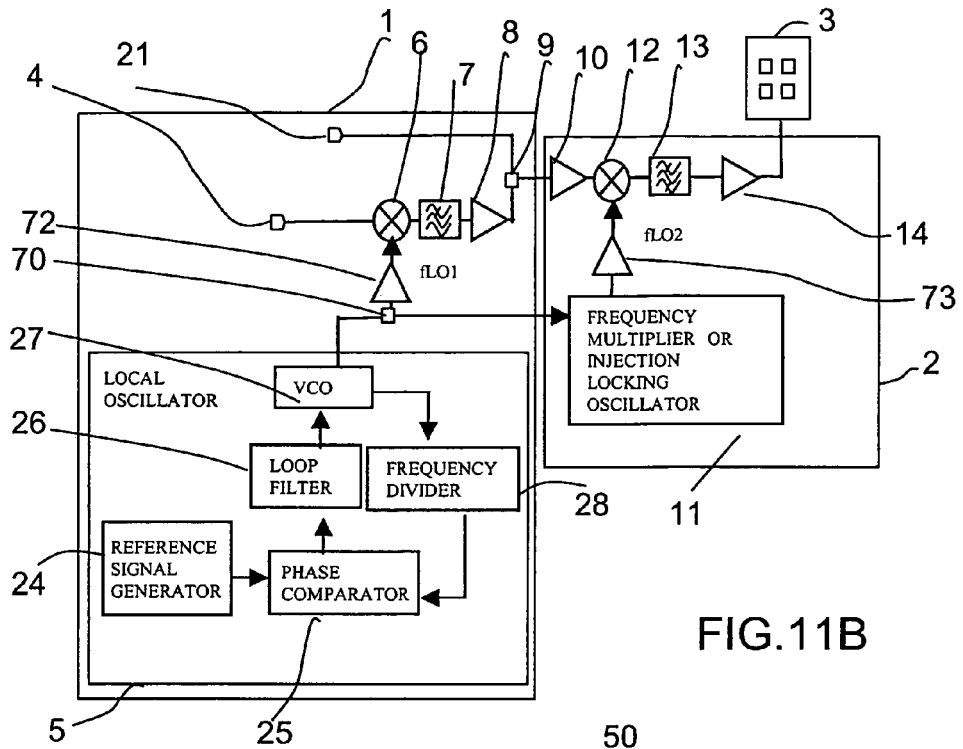
FIG. 11A is a schematic block diagram showing a millimeter wave band transmitter forming a millimeter wave band communication apparatus according to a seventh embodiment of the present invention.

The millimeter wave band transmitter of the seventh embodiment shown in FIG. 11A is similar to the millimeter wave band transmitter of the fifth embodiment shown in FIG. 9A except for the following point. The local oscillation signal component of local oscillation frequency fLO1 included in the output of frequency mixer 6 is completely removed by filter 7 so as to be absent in the millimeter wave band transmission signal.

Figure 11B:
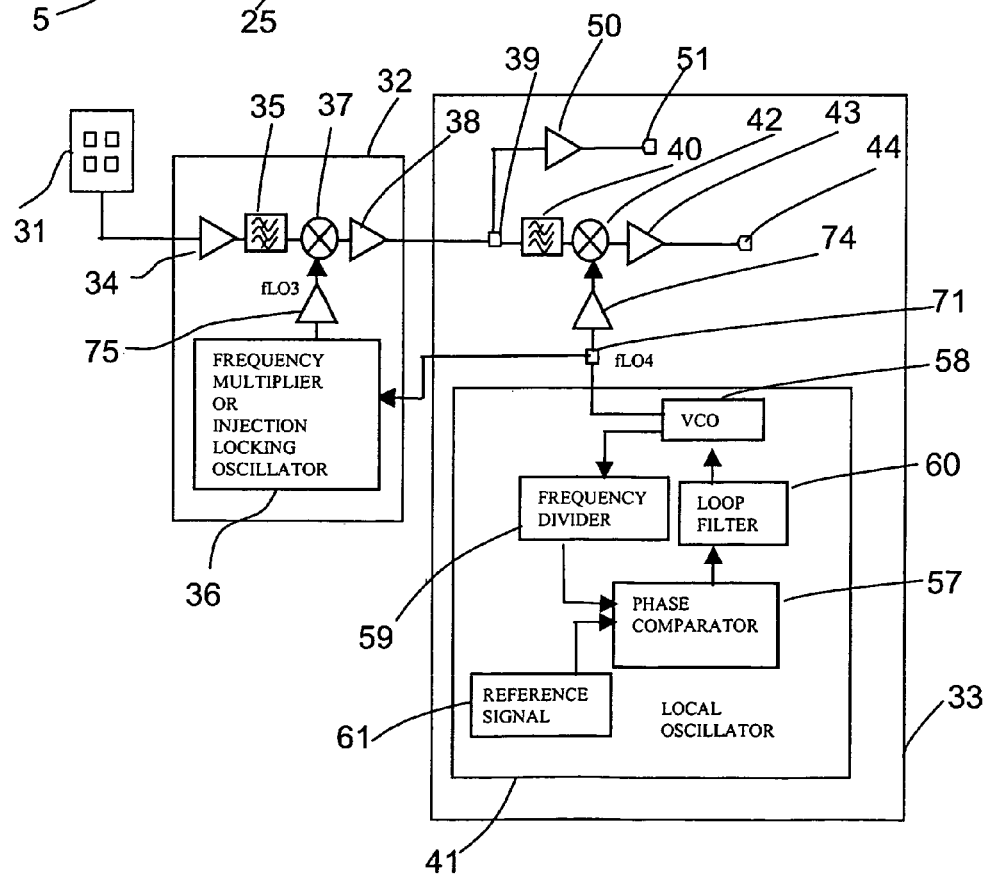
FIG. 11B is a schematic block diagram showing a millimeter wave band receiver forming the millimeter wave band communication apparatus of the seventh embodiment.

The millimeter wave band receiver according to the seventh embodiment shown in FIG. 11B is similar to the millimeter wave band receiver of the fifth embodiment shown in FIG. 9A except for the following point. Instead of using the residual local oscillation signal component sent from the transmitter side as in the fifth embodiment, local oscillator 41 is configured as a phase lock oscillator employing an independent signal reference source 61 formed of a crystal oscillator or a rubidium oscillator.

By virtue of not including the residual component of the local oscillation signal generated at the transmitter side in the millimeter wave band transmission signal of the millimeter wave band communication apparatus, reduction in the required power of transmission information such as data and video information can be prevented to improve the radio transmission distance. The function and advantage of the present structure are similar to those already described in relation with the sixth embodiment. Therefore, description thereof will not be repeated.

(8) Eighth Embodiment

A millimeter wave band radio communication apparatus according to an eighth embodiment of the present invention will be described with reference to FIGS. 12A and 12B.

Figure 12A:
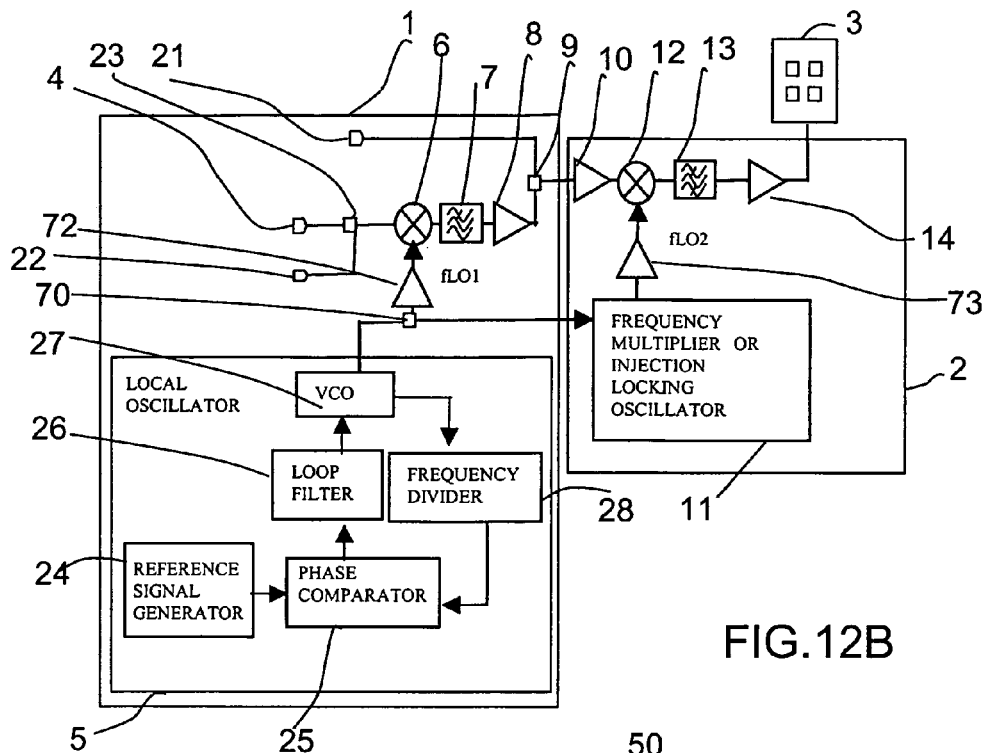
FIG. 12A is a schematic block diagram showing a millimeter wave band transmitter forming a millimeter wave band communication apparatus according to an eighth embodiment of the present invention.
Figure 12B:
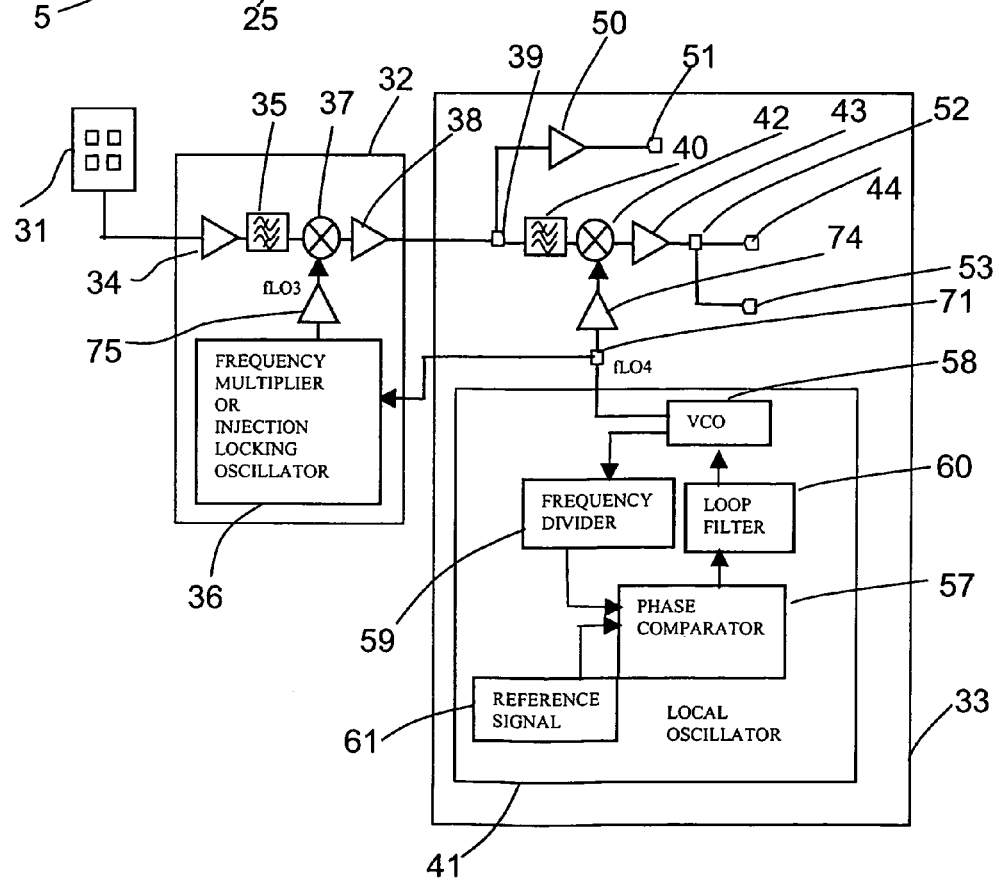
FIG. 12B is a schematic block diagram showing a millimeter wave band receiver forming the millimeter wave band communication apparatus of the eighth embodiment.
Figure 13:
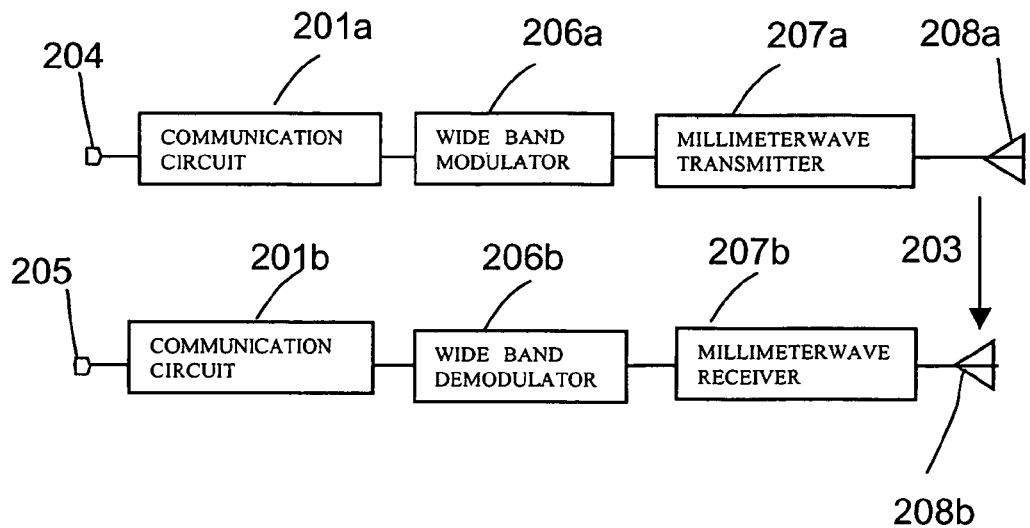
FIG. 13 is a schematic block diagram showing a structure of a conventional millimeter wave band radio communication apparatus.

The eighth embodiment of FIGS. 12A and 12B has the structure of the seventh embodiment applied to the millimeter wave band radio communication apparatus of the sixth embodiment having the three modulation signal wave inputs shown in FIGS. 10A and 10B.

In the millimeter wave band transmitter of the eighth embodiment shown in FIG. 12A, the local oscillation signal component of local oscillation frequency fLO1 output from local oscillator 5 is completely removed by filter 7, absent in the millimeter wave band multiplex signal wave. In the millimeter wave band receiver of the eighth embodiment shown in FIG. 12B, local oscillator 41 is configured as a phase locking oscillator including an independent reference signal generation source 61.

The function and advantage of the present structure are similar to those described already in relation with the seventh embodiment. Therefore, description thereof will not be repeated.

The present invention is not limited to the above-described embodiments in which a terrestrial broadcasting signal, a first satellite broadcasting signal and a second satellite broadcasting signals are employed as the first, second, and third modulation wave signals, respectively. One portion or the entirety of any of these first to third modulation signal waves may be used as a data signal owned by the user, a signal wave which is a modulated version of a video signal from a video camera or the like, or a signal wave which is a modulated version of a user's calling code.

Furthermore, a modulation signal wave may be used having a plurality of individual information signal waves such as a calling code multiplexed over a part or the entirety of a modulation signal wave of any of the first to third modulation signal waves. For example, in the case where a calling code is added and multiplexed on a portion of the first or second modulation signal wave, individual information of each user can be transmitted with security by demodulating the relevant calling code after reproducing the first or second modulation signal wave with the millimeter wave band receiver and drive the signal processing unit to obtain transmission information by the relevant calling code.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A millimeter wave band transmitter comprising:
 a frequency arranging circuit coupling a plurality of input modulation signal waves while frequency-converting at least one of said plurality of input modulation signal waves from a frequency position lower than a frequency position of at least one other of said plurality of input modulation signal waves to a frequency position adjacent to and higher than the frequency position of the at least one other of said plurality of input modulation signal waves along a frequency axis in order to generate a multiplex signal wave having respective frequency bands of said plurality of input modulation signal waves arranged on the frequency axis independent of each other,
 a frequency up-converter up-converting said multiplex signal wave to a millimeter wave band to generate a millimeter wave band multiplex signal wave, and
 a transmission circuit transmitting said millimeter wave band multiplex signal wave.

2. A millimeter wave band receiver comprising:
 a reception circuit receiving a millimeter wave band multiplex signal wave, said millimeter wave band multiplex signal wave generated by coupling a plurality of modulation signal waves while frequency-converting at least one of said plurality of modulation signal waves from a frequency position lower than a frequency position of at least one other of said plurality of modulation signal waves to a frequency position which is adjacent to and higher than that of the modulation signal wave along a frequency axis, and having respective frequency bands of said plurality of modulation signal waves arranged on the frequency axis independent of each other, a frequency down-converter down-converting said millimeter wave band multiplex signal wave from a millimeter wave band to generate a multiplex signal wave, and a frequency rearranging circuit dividing said multiplex signal wave while frequency-converting said at least one modulation signal wave from the frequency position higher than the frequency position of the at least one other of said plurality of modulation signal waves to the frequency position lower than the frequency position of the at least one other of said plurality of modulation signal waves along the frequency axis in order to restore said plurality of modulation signal waves respectively having the former frequency bands.

3. A millimeter wave band communication apparatus comprising:

a millimeter wave band transmitter receiving a plurality of input modulation signal waves to transmit a millimeter wave band multiplex signal wave, said millimeter wave band transmitter including a frequency arranging circuit coupling said plurality of input modulation signal waves while frequency-converting at least one of said plurality of input modulation signal waves from a frequency position lower than a frequency position of at least one other of said plurality of input modulation signal waves to a frequency position adjacent to and higher than the frequency position of the at least one other of said plurality of input modulation signal waves along a frequency axis in order to generate a multiplex signal wave having respective frequency bands of said plurality of input modulation signal waves arranged on the frequency axis independent of each other, a frequency up-converter up-converting said multiplex signal wave to the millimeter wave band to generate said millimeter wave band multiplex signal wave, and a transmission circuit transmitting said millimeter wave band multiplex signal wave; and a millimeter wave band receiver receiving said transmitted millimeter wave band multiplex signal wave to restore said plurality of input modulation signal waves, said millimeter wave band receiver including a reception circuit receiving said millimeter wave band multiplex signal wave, a frequency down-converter down-converting said millimeter wave band multiplex signal wave from the millimeter wave band to generate said multiplex signal wave, and a frequency rearranging circuit dividing said multiplex signal wave while frequency-converting said at least one modulation signal wave from the frequency position higher than the frequency position of the at least one other of said plurality of modulation signal waves to the frequency position lower than the frequency position of the at least one other of said plurality of modulation signal waves along the frequency axis in order to restore said plurality of input modulation signal waves respectively having the former frequency bands.

4. A millimeter wave band transmitter comprising:
a first input terminal of a first modulation signal wave,
a second input terminal of a second modulation signal wave,
a first local oscillator generating a first local oscillation signal of a first local oscillation frequency, a first frequency mixer mixing said first modulation signal wave with said first local oscillation signal to frequency-convert said first modulation signal wave from a frequency position lower than a frequency position of said second modulation signal wave to a frequency position adjacent to and higher than a frequency position of said second modulation signal wave along a frequency axis, a signal combiner coupling said frequency-converted first modulation signal wave with said second modulation signal wave to generate a multiplex signal wave, a second local oscillator generating a second local oscillation signal of a second local oscillation frequency, a second frequency mixer mixing said multiplex signal wave with said second local oscillation signal to up-convert said multiplex signal wave to the millimeter wave band to generate a millimeter wave band multiplex signal wave, and a transmission circuit transmitting said millimeter wave band multiplex signal wave.

5. The millimeter wave band transmitter according to claim 4, wherein said first frequency mixer up-converts said first modulation signal wave, further comprising a filter extracting and applying to said signal combiner a lower side band signal of said up-converted first modulation signal wave.

6. The millimeter wave band transmitter according to claim 5, wherein said first local oscillation frequency is set so that said lower side band signal of said up-converted first modulation signal wave is arranged adjacent a higher frequency side of said second modulation signal wave.

7. The millimeter wave band transmitter according to claim 6, wherein said first local oscillation frequency is set to a frequency from a lower microwave band to a higher microwave band.

8. The millimeter wave band transmitter according to claim 4, wherein said millimeter wave band multiplex signal wave includes said first local oscillation signal up-converted to the millimeter wave band.

9. The millimeter wave band transmitter according to claim 8, wherein said second local oscillator receives said first local oscillation signal from said first local oscillator to generate said second local oscillation signal by frequency multiplying or injection locking according to said first local oscillation signal.

10. The millimeter wave band transmitter according to claim 4, wherein said second local oscillator receives said first local oscillation signal from said first local oscillator to generate said second local oscillation signal by frequency multiplying or injection locking according to said first local oscillation signal.

11. The millimeter wave band transmitter according to claim 4, wherein at least one of said first and second modulation signal waves is a modulation signal wave having a user's individual information signal wave multiplexed over a part or entirety of said at least one of said first and second modulation signal waves.

12. A millimeter wave band receiver comprising:
a reception circuit receiving a transmitted millimeter wave band multiplex signal wave that is a multiplex signal wave up-converted to a millimeter wave band by a second local oscillation frequency, said multiplex signal wave generated by coupling first and second modulation signal waves after said first modulation signal wave is frequency-converted from a frequency position lower than a frequency position of said second modulation signal wave to a frequency position which is adjacent to and higher than said second modulation signal wave along a frequency axis by a first local oscillation frequency, a first local oscillator generating a first local oscillation signal of said second local oscillation frequency, a first frequency mixer mixing said millimeter wave band multiplex signal wave with said first local oscillation signal to down-convert said millimeter wave band multiplex signal wave from the millimeter wave band to generate said multiplex signal wave, a signal distributor dividing said down-converted multiplex signal wave into said frequency-converted first modulation signal wave, and said second modulation signal wave, a second local oscillator generating a second local oscillation signal of said first local oscillation frequency, a second frequency mixer mixing said frequency-converted first modulation signal wave with said second local oscillation signal to frequency-convert again said first modulation signal wave from the frequency position higher than the frequency position of said second modulation signal wave to the frequency position lower than the frequency position of said second modulation signal wave along the frequency axis in order to restore said first modulation signal wave, a first output terminal providing said restored first modulation signal wave, and a second output terminal providing said second modulation signal wave supplied from said signal distributor.

13. The millimeter wave band receiver according to claim 12, wherein said transmitted millimeter wave band multiplex signal wave includes a signal component of said first local oscillation frequency up-converted to the millimeter wave band, said signal distributor extracts a signal component of said first local oscillation frequency from said down-converted multiplex signal wave, and said second local oscillator generates said second local oscillation signal by a phase locking loop according to said extracted first local oscillation frequency signal component.

14. The millimeter wave band receiver according to claim 13, wherein said first local oscillator receives said second local oscillation signal from said second local oscillator to generate said first local oscillation signal by frequency multiplexing or injection locking according to said second local oscillation signal.

15. The millimeter wave band receiver according to claim 12, wherein said first local oscillator receives said second local oscillation signal from said second local oscillator to generate said first local oscillation signal by frequency multiplying or injection locking according to said second local oscillation signal.

16. The millimeter wave band receiver according to claim 12, wherein at least one of said first and second modulation signal waves is a modulation signal wave having a user's individual information signal wave multiplexed over a part or entirety of said at least one of said first and second modulation signal waves.

17. A millimeter wave band communication apparatus comprising:

a millimeter wave band transmitter receiving first and second input modulation signal waves to transmit a millimeter wave band multiplex signal wave, said millimeter wave band transmitter including a first input terminal of said first modulation signal wave, a second input terminal of said second modulation signal wave, a first local oscillator generating a first local oscillation signal of a first local oscillation frequency, a first frequency mixer mixing said first modulation signal wave with said first local oscillation signal to frequency-convert said first modulation signal wave from a frequency position lower than a frequency position of said second modulation signal wave to a frequency position adjacent to and higher than said second modulation signal wave along a frequency axis, a signal combiner coupling said frequency-converted first modulation signal wave with said second modulation signal wave to generate a multiplex signal wave, a second local oscillator generating a second local oscillation signal of a second local oscillation frequency, a second frequency mixer mixing said multiplex signal wave with said second local oscillation signal to up-convert said multiplex signal wave to the millimeter wave band to generate said millimeter wave band multiplex signal wave, and a transmission circuit transmitting said millimeter wave band multiplex signal wave; and a millimeter wave band receiver receiving said millimeter wave band multiplex signal wave to restore said first and second modulation signal waves, said millimeter wave band receiver including a reception circuit receiving said transmitted millimeter wave band multiplex signal wave, a third local oscillator generating a third local oscillation signal of said second local oscillation frequency, a third frequency mixer mixing said millimeter wave band multiplex signal wave with said third local oscillation signal to down-convert said millimeter wave band multiplex signal wave from the millimeter wave band to generate said multiplex signal wave, a signal distributor dividing said down-converted multiplex signal wave into said frequency-converted first modulation signal wave, and said second modulation signal wave, a fourth local oscillator generating a fourth local oscillation signal of said first local oscillation frequency, a fourth frequency mixer mixing said frequency-converted first modulation signal wave with said fourth local oscillation signal to frequency-convert again said first modulation signal wave from the frequency position higher than the frequency position of said second modulation signal wave to the frequency position lower than the frequency position of said second modulation signal wave along the frequency axis in order to restore said first modulation signal wave, a first output terminal providing said restored first modulation signal wave, and a second output terminal providing a second modulation signal wave supplied from said signal distributor.

18. The millimeter wave band communication apparatus according to claim 17, wherein said first frequency mixer up-converts said first modulation signal wave, said millimeter wave band transmitter further comprising a filter extracting and applying to said signal distributor a signal of a lower side band of said up-converted first modulation signal wave.

19. The millimeter wave band communication apparatus according to claim 18, wherein said first local oscillation frequency is set so that said lower side band signal of said up-converted first modulation signal wave is arranged adjacent a higher frequency side of said second modulation signal wave.

20. The millimeter wave band communication apparatus according to claim 19, wherein said first local oscillation frequency is set to a frequency from a lower microwave band to a higher microwave band.

21. The millimeter wave band communication apparatus according to claim 17, wherein
said transmitted millimeter wave band multiplex signal wave includes a signal component of said first local oscillation frequency up-converted to the millimeter wave band,
said signal distributor extracts a signal component of said first local oscillation frequency from said down-converted multiplex signal wave, and
said fourth local oscillator generates said fourth local oscillation signal by a phase locking loop according to said extracted first local oscillation frequency signal component.

22. The millimeter wave band communication apparatus according to claim 21, wherein said second local oscillator receives said first local oscillation signal from said first local oscillator to generate said second local oscillation signal by frequency multiplexing or injection locking according to said first local oscillation signal,
wherein said third local oscillator receives said fourth local oscillation signal from said fourth local oscillator to generate said third local oscillation signal by frequency multiplexing or injection locking according to said fourth local oscillation signal.

23. The millimeter wave band communication apparatus according to claim 17, wherein said second local oscillator receives said first local oscillation signal from said first local oscillator to generate said second local oscillation signal by frequency multiplying or injection locking according to said first local oscillation signal,
wherein said third local oscillator receives said fourth local oscillation signal from said fourth local oscillator to generate said third local oscillation signal by frequency multiplexing or injection locking according to said fourth local oscillation signal.

24. The millimeter wave band communication apparatus according to claim 17, wherein at least one of said first and second modulation signal waves is a modulation signal wave having a user's individual information signal wave multiplexed over a portion or entirety of said at least one of said first and second modulation signal waves.

25. A millimeter wave band transmitter comprising:
a first input terminal of a first modulation signal wave,
a second input terminal of a second modulation signal wave,
a third input terminal of a third modulation signal wave,
a first signal combiner coupling said first modulation signal wave with said third modulation signal wave to generate a first multiplex signal wave,
a first local oscillator generating a first local oscillation signal of a first local oscillation frequency,
a first frequency mixer mixing said first multiplex signal wave with said first local oscillation signal to frequency-convert said first multiplex signal wave,
a second signal combiner coupling said frequency-converted first multiplex signal wave with said second modulation signal wave to generate a second multiplex signal wave,
a second local oscillator generating a second local oscillation signal of a second local oscillation frequency,
a second frequency mixer mixing said second multiplex signal wave with said second local oscillation signal to up-convert said second multiplex signal wave to the millimeter wave band to generate a millimeter wave band multiplex signal wave, and
a transmission circuit transmitting said millimeter wave band multiplex signal wave.

26. The millimeter wave band transmitter according to claim 25, wherein said first frequency mixer up-converts said first multiplex signal wave,
further comprising a filter extracting and applying to said second signal combiner a signal of a lower side band of said up-converted first multiplex signal wave.

27. The millimeter wave band transmitter according to claim 26, wherein said first local oscillation frequency is set so that said lower side band signal of said up-converted first multiplex signal wave is arranged adjacent a higher frequency side of said second modulation signal wave.

28. The millimeter wave band transmitter according to claim 27, wherein said first local oscillation frequency is set to a frequency from a lower microwave band to a higher microwave band.

29. The millimeter wave band transmitter according to claim 25, wherein said millimeter wave band multiplex signal wave includes said first local oscillation signal up-converted to the millimeter wave band.

30. The millimeter wave band transmitter according to claim 29, wherein said second local oscillator receives said first local oscillation signal from said first local oscillator to generate said second local oscillation signal by frequency multiplexing or injection locking according to said first local oscillation signal.

31. The millimeter wave band transmitter according to claim 25, wherein said second local oscillator receives said first local oscillation signal from said first local oscillator to generate said second local oscillation signal by frequency multiplexing or injection locking according to said first local oscillation signal.

32. The millimeter wave band transmitter according to claim 25, wherein at least one of said first, second and third modulation signal waves is a modulation signal wave having a user's individual information signal wave multiplexed over a part or entirety of said at least one modulation signal wave.

33. A millimeter wave band receiver comprising:
a reception circuit receiving a transmitted millimeter wave band multiplex signal wave which is a second multiplex signal wave up-converted to a millimeter wave band by a second local oscillation frequency, said second multiplex signal wave generated by coupling a first multiplex signal wave generated by coupling first and third modulation signal waves with a second modulation signal wave after said first multiplex signal wave is frequency-converted by a first local oscillation frequency,
a first local oscillator generating a first local oscillation signal of said second local oscillation frequency,
a first frequency mixer mixing said millimeter wave band multiplex signal wave with said first local oscillation signal to down-convert said millimeter wave band multiplex signal wave from the millimeter wave band to generate said second multiplex signal wave,
a first signal distributor dividing said down-converted second multiplex signal wave into said frequency-converted first multiplex signal wave, and said second modulation signal wave, a second local oscillator generating a second local oscillation signal of said first local oscillation frequency, a second frequency mixer mixing said frequency-converted first multiplex signal wave with said second local oscillation signal to frequency-convert again said first multiplex signal wave to restore said first multiplex signal wave, a second signal distributor dividing said restored first multiplex signal wave into said first modulation signal wave and said third modulation signal wave, a first output terminal providing said first modulation signal wave supplied from said second signal distributor, a second output terminal providing said second modulation signal wave supplied from said first signal distributor, and a third output terminal providing said third modulation signal wave supplied from said second signal distributor.

34. The millimeter wave band receiver according to claim 33, wherein said transmitted millimeter wave band multiplex signal wave includes a signal component of said first local oscillation frequency up-converted to the millimeter wave band, said first signal distributor extracts a signal component of said first local oscillation frequency from said down-converted second multiplex signal wave, and said second local oscillator generates said second local oscillation signal by a phase locking loop according to said extracted first local oscillation frequency signal component.

35. The millimeter wave band receiver according to claim 34, wherein said first local oscillator receives said second local oscillation signal from said second local oscillator to generate said first local oscillation signal by frequency multiplexing or injection locking according to said second local oscillation signal.

36. The millimeter wave band receiver according to claim 33, wherein said first local oscillator receives said second local oscillation signal from said second local oscillator to generate said first local oscillation signal by frequency multiplexing or injection locking according to said second local oscillation signal.

37. The millimeter wave band receiver according to claim 33, wherein at least one of said first, second and third modulation signal waves is a modulation signal wave having a user's individual information signal wave multiplexed over a part or entirety of said at least one modulation signal wave.

38. A millimeter wave band communication apparatus comprising:

a millimeter wave band transmitter receiving first, second and third input modulation signal waves to transmit a millimeter wave band multiplex signal wave, said millimeter wave band transmitter including a first input terminal of said first modulation signal wave, a second input terminal of said second modulation signal wave, a third input terminal of said third modulation signal wave, a first signal combiner coupling said first modulation signal wave with said third modulation signal wave to generate a first multiplex signal wave, a first local oscillator generating a first local oscillation signal of a first local oscillation frequency, a first frequency mixer mixing said first multiplex signal wave with said first local oscillation signal to frequency-convert said first multiplex signal wave, a second signal combiner coupling said frequency-converted first multiplex signal wave with said second modulation signal wave to generate a second multiplex signal wave, a second local oscillator generating a second local oscillation signal of said second local oscillation frequency, a second frequency mixer mixing said second multiplex signal wave with said second local oscillation signal to up-convert said second multiplex signal wave to the millimeter wave band to generate said millimeter wave band multiplex signal wave, and a transmission circuit transmitting said millimeter wave band multiplex signal wave; and a millimeter wave band receiver receiving said millimeter wave band multiplex signal wave to restore said first, second and third modulation signal waves, said millimeter wave band receiver including a reception circuit receiving said transmitted millimeter wave band multiplex signal wave, a third local oscillator generating a third local oscillation signal of said second local oscillation frequency, a third frequency mixer mixing said millimeter wave band multiplex signal wave with said third local oscillation signal to down-convert said millimeter wave band multiplex signal wave from the millimeter wave band to generate said second multiplex signal wave, a first signal distributor dividing said down-converted second multiplex signal wave into said frequency-converted first multiplex signal wave, and said second modulation signal wave, a fourth local oscillator generating a fourth local oscillation signal of said first local oscillation frequency, a fourth frequency mixer mixing said frequency-converted first multiplex signal wave with said fourth local oscillation signal to frequency-convert again said first multiplex signal wave to restore said first multiplex signal wave, a second signal distributor dividing said restored first multiplex signal wave into said first modulation signal wave and said third modulation signal wave, a first output terminal providing said first modulation signal wave supplied from said second signal distributor, a second output terminal providing said second modulation signal wave supplied from said first signal distributor, and a third output terminal providing said third modulation signal wave supplied from said second signal distributor.

39. The millimeter wave band communication apparatus according to claim 38, wherein said first frequency mixer up-converts said first multiplex signal wave, said millimeter wave band transmitter further including a filter extracting and applying to said second signal combiner a signal of a lower side band of said up-converted first multiplex signal wave.

40. The millimeter wave band communication apparatus according to claim 39, wherein said first local oscillation frequency is set so that said lower side band signal of said up-converted first multiplex signal wave is arranged adjacent to a higher frequency side of said second modulation signal wave.

41. The millimeter wave band communication apparatus according to claim 40, wherein said first local oscillation frequency is set to a frequency from a lower microwave band to a higher microwave band.

42. The millimeter wave band communication apparatus according to claim 38, wherein said transmitted millimeter wave band multiplex signal wave includes a signal component of said first local oscillation frequency up-converted to the millimeter wave band, said first signal distributor extracts a signal component of said first local oscillation frequency from said down-converted second multiplex signal wave, and said fourth local oscillator generates said fourth local oscillation signal by a phase locking loop according to said extracted first local oscillation frequency signal component.

43. The millimeter wave band communication apparatus according to claim 42, wherein said second local oscillator receives said first local oscillation signal from said first local oscillator to generate said second local oscillation signal by frequency multiplexing or injection locking according to said first local oscillation signal, wherein said third local oscillator receives said fourth local oscillation signal from said fourth local oscillator to generate said third local oscillation signal by frequency multiplexing or injection locking according to said fourth local oscillation signal.

44. The millimeter wave band communication apparatus according to claim 38, wherein said second local oscillator receives said first local oscillation signal from said first local oscillator to generate said second local oscillation signal by frequency multiplexing or injection locking according to said first local oscillation signal, wherein said third local oscillator receives said fourth local oscillation signal from said fourth local oscillator to generate said third local oscillation signal by frequency multiplexing or injection locking according to said fourth local oscillation signal.

45. The millimeter wave band communication apparatus according to claim 38, wherein at least one of said first, second and third modulation signal waves is a modulation signal wave having a user's individual information signal wave multiplexed over a part or entirety of said at least one modulation signal wave.

46. A millimeter wave band receiver comprising:

a reception circuit receiving a millimeter wave band multiplex signal wave, said multiplex signal wave having been generated by coupling a plurality of modulation signal waves while frequency-converting at least one of said plurality of modulation signal waves from a frequency position lower than a frequency position of at least one other of said plurality of modulation signal waves to a frequency position which is adjacent to and higher than the at least one other of said plurality of modulation signal waves along a frequency axis, and having respective frequency bands of said plurality of modulation signal waves arranged on the frequency axis independent of each other, a frequency down-converter down-converting said millimeter wave band multiplex signal wave from a millimeter wave band to generate a multiplex signal wave, and a frequency rearranging circuit dividing said multiplex signal wave while frequency-converting said at least one modulation signal wave and maintaining the frequency band of at least one other modulation signal wave to restore said plurality of modulation signal waves to respective original broadcasted frequency bands.

47. A millimeter wave band receiver comprising:

a reception circuit receiving a millimeter wave band multiplex signal wave, said multiplex signal wave having been generated by coupling a plurality of modulation signal waves while frequency-converting at least one of said plurality of modulation signal waves from a frequency position lower than a frequency position of at least one other of said plurality of modulation signal waves to a frequency position which is higher than that of the modulation signal wave along a frequency axis, and having respective frequency bands of said plurality of modulation signal waves arranged on the frequency axis independent of each other, a frequency down-converter down-converting said millimeter wave band multiplex signal wave from a millimeter wave band to generate a multiplex signal wave, and a frequency rearranging circuit dividing said multiplex signal wave while frequency-converting said at least one modulation signal wave and maintaining the frequency band of at least one other modulation signal wave to restore said plurality of modulation signal waves to respective original broadcasted frequency bands.

\* \* \* \* \*